United States Patent
Uzoh et al.

(10) Patent No.: US 9,728,527 B2
(45) Date of Patent: Aug. 8, 2017

(54) MULTIPLE BOND VIA ARRAYS OF DIFFERENT WIRE HEIGHTS ON A SAME SUBSTRATE

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/925,807

(22) Filed: Oct. 28, 2015

(65) Prior Publication Data

US 2016/0049390 A1    Feb. 18, 2016

Related U.S. Application Data

(62) Division of application No. 14/087,252, filed on Nov. 22, 2013, now Pat. No. 9,263,394.

(51) Int. Cl.
*H01L 23/48* (2006.01)
*H01L 25/00* (2006.01)
(Continued)

(52) U.S. Cl.
CPC ........ *H01L 25/50* (2013.01); *H01L 21/31111* (2013.01); *H01L 21/4853* (2013.01);
(Continued)

(58) Field of Classification Search
CPC ............. H01L 2224/4823; H01L 24/73; H01L 25/50; H01L 21/4853; H01L 21/4857;
(Continued)

(56) References Cited

U.S. PATENT DOCUMENTS 3,289,452 A    12/1966    Koellner
3,358,897 A    12/1967    Christensen
(Continued)

FOREIGN PATENT DOCUMENTS

CN    1352804 A    6/2002
CN    1641832 A    7/2005
(Continued)

OTHER PUBLICATIONS

Brochure, "High Performance BVA PoP Package for Mobile Systems," Invensas Corporation, May 2013, 20 pages.
(Continued)

*Primary Examiner* — Benjamin Sandvik
*Assistant Examiner* — Herve Assouman

(57) ABSTRACT

An apparatus relating generally to a substrate is disclosed. In such an apparatus, a first bond via array has first wires extending from a surface of the substrate. A second bond via array has second wires extending from the surface of the substrate. The first bond via array is disposed at least partially within the second bond via array. The first wires of the first bond via array are of a first height. The second wires of the second bond via array are of a second height greater than the first height for coupling of at least one die to the first bond via array at least partially disposed within the second bond via array.

20 Claims, 19 Drawing Sheets

(51) Int. Cl.

| | |
|---|---|
| *H01L 23/538* | (2006.01) |
| *H01L 23/00* | (2006.01) |
| *H01L 23/498* | (2006.01) |
| *H01L 21/48* | (2006.01) |
| *H01L 25/065* | (2006.01) |
| *H01L 21/311* | (2006.01) |
| *H01L 21/56* | (2006.01) |
| *H01L 21/768* | (2006.01) |

(52) U.S. Cl.
CPC ...... *H01L 21/563* (2013.01); *H01L 21/76898* (2013.01); *H01L 23/49811* (2013.01); *H01L 23/5384* (2013.01); *H01L 24/03* (2013.01); *H01L 24/05* (2013.01); *H01L 24/11* (2013.01); *H01L 24/13* (2013.01); *H01L 24/14* (2013.01); *H01L 24/24* (2013.01); *H01L 24/43* (2013.01); *H01L 24/73* (2013.01); *H01L 24/85* (2013.01); *H01L 24/89* (2013.01); *H01L 24/94* (2013.01); *H01L 24/97* (2013.01); *H01L 25/0657* (2013.01); *H01L 24/02* (2013.01); *H01L 24/16* (2013.01); *H01L 24/17* (2013.01); *H01L 24/32* (2013.01); *H01L 24/33* (2013.01); *H01L 24/45* (2013.01); *H01L 24/48* (2013.01); *H01L 24/81* (2013.01); *H01L 2224/0239* (2013.01); *H01L 2224/02311* (2013.01); *H01L 2224/02317* (2013.01); *H01L 2224/02371* (2013.01); *H01L 2224/02372* (2013.01); *H01L 2224/0331* (2013.01); *H01L 2224/0332* (2013.01); *H01L 2224/0333* (2013.01); *H01L 2224/0345* (2013.01); *H01L 2224/0347* (2013.01); *H01L 2224/0391* (2013.01); *H01L 2224/03452* (2013.01); *H01L 2224/03462* (2013.01); *H01L 2224/03464* (2013.01); *H01L 2224/03614* (2013.01); *H01L 2224/03912* (2013.01); *H01L 2224/03914* (2013.01); *H01L 2224/0401* (2013.01); *H01L 2224/04042* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05169* (2013.01); *H01L 2224/05184* (2013.01); *H01L 2224/05547* (2013.01); *H01L 2224/05565* (2013.01); *H01L 2224/05568* (2013.01); *H01L 2224/05569* (2013.01); *H01L 2224/05611* (2013.01); *H01L 2224/05616* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05669* (2013.01); *H01L 2224/05684* (2013.01); *H01L 2224/0823* (2013.01); *H01L 2224/08146* (2013.01); *H01L 2224/1134* (2013.01); *H01L 2224/1147* (2013.01); *H01L 2224/1191* (2013.01); *H01L 2224/11462* (2013.01); *H01L 2224/11464* (2013.01); *H01L 2224/11903* (2013.01); *H01L 2224/131* (2013.01); *H01L 2224/13022* (2013.01); *H01L 2224/13023* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/13184* (2013.01); *H01L 2224/13565* (2013.01); *H01L 2224/13616* (2013.01); *H01L 2224/1403* (2013.01); *H01L 2224/14131* (2013.01); *H01L 2224/14134* (2013.01); *H01L 2224/16145* (2013.01); *H01L 2224/16146* (2013.01); *H01L 2224/16148* (2013.01); *H01L 2224/16227* (2013.01); *H01L 2224/17181* (2013.01); *H01L 2224/244* (2013.01); *H01L 2224/24147* (2013.01); *H01L 2224/24227* (2013.01); *H01L 2224/32145* (2013.01); *H01L 2224/32225* (2013.01); *H01L 2224/3303* (2013.01); *H01L 2224/33181* (2013.01); *H01L 2224/45015* (2013.01); *H01L 2224/45147* (2013.01); *H01L 2224/45565* (2013.01); *H01L 2224/4805* (2013.01); *H01L 2224/48108* (2013.01); *H01L 2224/48149* (2013.01); *H01L 2224/4903* (2013.01); *H01L 2224/49426* (2013.01); *H01L 2224/73201* (2013.01); *H01L 2224/73204* (2013.01); *H01L 2224/73253* (2013.01); *H01L 2224/73265* (2013.01); *H01L 2224/81192* (2013.01); *H01L 2224/81193* (2013.01); *H01L 2224/81825* (2013.01); *H01L 2224/94* (2013.01); *H01L 2224/97* (2013.01); *H01L 2225/0651* (2013.01); *H01L 2225/06506* (2013.01); *H01L 2225/06524* (2013.01); *H01L 2225/06548* (2013.01); *H01L 2924/00014* (2013.01); *H01L 2924/01322* (2013.01); *H01L 2924/12042* (2013.01); *H01L 2924/15192* (2013.01); *H01L 2924/15311* (2013.01); *H01L 2924/15787* (2013.01); *H01L 2924/15788* (2013.01); *H01L 2924/16152* (2013.01); *H01L 2924/16251* (2013.01); *H01L 2924/181* (2013.01); *H01L 2924/19107* (2013.01); *H01L 2924/381* (2013.01); *H01L 2924/386* (2013.01); *H01L 2924/3841* (2013.01)

(58) Field of Classification Search
CPC ............... H01L 21/486; H01L 21/4885; H01L 21/4889; H01L 21/50; H01L 21/52; H01L 21/72
USPC ....... 257/712, 777, 778, 737, 738, 734, 773, 257/774, 713
See application file for complete search history.

(56) References Cited

U.S. PATENT DOCUMENTS

| | | |
|---|---|---|
| 3,430,835 A | 3/1969 | Grable et al. |
| 3,623,649 A | 11/1971 | Keisling |
| 3,795,037 A | 3/1974 | Luttmer |
| 3,900,153 A | 8/1975 | Beerwerth et al. |
| 4,067,104 A | 1/1978 | Tracy |
| 4,072,816 A | 2/1978 | Gedney et al. |
| 4,213,556 A | 7/1980 | Persson et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,642,889 A | 2/1987 | Grabbe |
| 4,667,267 A | 5/1987 | Hernandez et al. |
| 4,695,870 A | 9/1987 | Patraw |
| 4,716,049 A | 12/1987 | Patraw |
| 4,725,692 A | 2/1988 | Ishii et al. |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,925,083 A | 5/1990 | Farassat et al. |
| 4,955,523 A | 9/1990 | Carlommagno et al. |

(56) References Cited

U.S. PATENT DOCUMENTS

| | | |
|---|---|---|
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,007 A | 11/1991 | Otsuka et al. |
| 5,067,382 A | 11/1991 | Zimmerman et al. |
| 5,083,697 A | 1/1992 | Difrancesco |
| 5,095,187 A | 3/1992 | Gliga |
| 5,133,495 A | 7/1992 | Angulas et al. |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,203,075 A | 4/1993 | Angulas et al. |
| 5,214,308 A | 5/1993 | Nishiguchi et al. |
| 5,220,489 A | 6/1993 | Barreto et al. |
| 5,222,014 A | 6/1993 | Lin |
| 5,238,173 A | 8/1993 | Ura et al. |
| 5,241,456 A | 8/1993 | Marcinkiewicz et al. |
| 5,316,788 A | 5/1994 | Dibble et al. |
| 5,340,771 A | 8/1994 | Rostoker |
| 5,346,118 A | 9/1994 | Degani et al. |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,736,785 A | 4/1998 | Chiang et al. |
| 5,766,987 A | 6/1998 | Mitchell et al. |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,830,389 A | 11/1998 | Capote et al. |
| 5,831,836 A | 11/1998 | Long et al. |
| 5,839,191 A | 11/1998 | Economy et al. |
| 5,854,507 A | 12/1998 | Miremadi et al. |
| 5,898,991 A | 5/1999 | Fogel et al. |
| 5,908,317 A | 6/1999 | Heo |
| 5,912,505 A | 6/1999 | Itoh et al. |
| 5,948,533 A | 9/1999 | Gallagher et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,000,126 A | 12/1999 | Pai |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,145,733 A | 11/2000 | Streckfuss et al. |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,180,881 B1 | 1/2001 | Isaak |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,211,574 B1 | 4/2001 | Tao et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,399,426 B1 | 6/2002 | Capote et al. |
| 6,407,448 B2 | 6/2002 | Chun |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,476,503 B1 | 11/2002 | Imamura et al. |
| 6,476,583 B2 | 11/2002 | McAndrews |
| 6,486,545 B1 | 11/2002 | Glenn et al. |
| 6,489,182 B2 | 12/2002 | Kwon |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,653,170 B1 | 11/2003 | Lin |
| 6,684,007 B2 | 1/2004 | Yoshimura et al. |
| 6,687,988 B1 | 2/2004 | Sugiura et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,730,544 B1 | 5/2004 | Yang |
| 6,733,711 B2 | 5/2004 | Durocher et al. |
| 6,734,542 B2 | 5/2004 | Nakatani et al. |

(56) References Cited

U.S. PATENT DOCUMENTS

| | | |
|---|---|---|
| 6,746,894 B2 | 6/2004 | Fee et al. |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,790,757 B1 | 9/2004 | Chittipeddi et al. |
| 6,815,257 B2 | 11/2004 | Yoon et al. |
| 6,825,552 B2 | 11/2004 | Light et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1 | 1/2006 | Fan et al. |
| 6,989,122 B1 | 1/2006 | Pham et al. |
| 7,009,297 B1 | 3/2006 | Chiang et al. |
| 7,045,884 B2 | 5/2006 | Standing |
| 7,051,915 B2 | 5/2006 | Mataguchi |
| 7,052,935 B2 | 5/2006 | Pai et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,547 B2 | 7/2006 | Kang et al. |
| 7,071,573 B1 | 7/2006 | Lin |
| 7,078,822 B2 | 7/2006 | Dias et al. |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,198,980 B2 | 4/2007 | Jiang et al. |
| 7,205,670 B2 | 4/2007 | Oyama |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,262,124 B2 | 8/2007 | Fujisawa |
| 7,268,421 B1 | 9/2007 | Lin |
| 7,276,799 B2 | 10/2007 | Lee et al. |
| 7,294,920 B2 | 11/2007 | Chen et al. |
| 7,294,928 B2 | 11/2007 | Bang et al. |
| 7,301,770 B2 | 11/2007 | Campbell et al. |
| 7,307,348 B2 | 12/2007 | Wood et al. |
| 7,323,767 B2 | 1/2008 | James et al. |
| 7,344,917 B2 | 3/2008 | Gautham |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,453,157 B2 | 11/2008 | Haba et al. |
| 7,456,091 B2 | 11/2008 | Kuraya et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,535,090 B2 | 5/2009 | Furuyama et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,592,638 B2 | 9/2009 | Kim |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,482 B2 | 3/2010 | Nishida et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,777,238 B2 | 8/2010 | Nishida et al. |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,855,464 B2 | 12/2010 | Shikano |
| 7,857,190 B2 | 12/2010 | Takahashi et al. |
| 7,880,290 B2 | 2/2011 | Park |
| 7,892,889 B2 | 2/2011 | Howard et al. |
| 7,898,083 B2 | 3/2011 | Castro |
| 7,902,644 B2 | 3/2011 | Huang et al. |
| 7,911,805 B2 | 3/2011 | Haba |
| 7,919,846 B2 | 4/2011 | Hembree |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 8,012,797 B2 | 9/2011 | Shen et al. |
| 8,020,290 B2 | 9/2011 | Sheats |
| 8,035,213 B2 | 10/2011 | Lee et al. |
| 8,039,960 B2 | 10/2011 | Lin |
| 8,039,970 B2 | 10/2011 | Yamamori et al. |
| 8,053,814 B2 | 11/2011 | Chen et al. |
| 8,058,101 B2 | 11/2011 | Haba et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,119,516 B2 | 2/2012 | Endo |
| 8,120,054 B2 | 2/2012 | Seo et al. |

(56) References Cited

U.S. PATENT DOCUMENTS

| | | | |
|---|---|---|---|
| 8,138,584 B2 | 3/2012 | Wang et al. |
| 8,143,141 B2 | 3/2012 | Sugiura et al. |
| 8,158,888 B2 | 4/2012 | Shen et al. |
| 8,207,604 B2 | 6/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,263,435 B2 | 9/2012 | Choi et al. |
| 8,264,091 B2 | 9/2012 | Cho et al. |
| 8,278,746 B2 | 10/2012 | Ding et al. |
| 8,288,854 B2 | 10/2012 | Weng et al. |
| 8,299,368 B2 | 10/2012 | Endo |
| 8,304,900 B2 | 11/2012 | Jang et al. |
| 8,314,492 B2 | 11/2012 | Egawa |
| 8,319,338 B1 | 11/2012 | Berry et al. |
| 8,324,633 B2 | 12/2012 | McKenzie et al. |
| 8,349,735 B2 | 1/2013 | Pagaila et al. |
| 8,354,297 B2 | 1/2013 | Pagaila et al. |
| 8,372,741 B1 | 2/2013 | Co et al. |
| 8,404,520 B1 | 3/2013 | Chau et al. |
| 8,409,922 B2 | 4/2013 | Camacho et al. |
| 8,415,704 B2 | 4/2013 | Ivanov et al. |
| 8,476,770 B2 | 7/2013 | Shao et al. |
| 8,482,111 B2 | 7/2013 | Haba |
| 8,507,927 B2 | 8/2013 | Iida et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,392 B2 | 10/2013 | Chua et al. |
| 8,618,659 B2 | 12/2013 | Sato et al. |
| 8,646,508 B2 | 2/2014 | Kawada |
| 8,653,676 B2 | 2/2014 | Kim et al. |
| 8,659,164 B2 | 2/2014 | Haba |
| 8,680,662 B2 | 3/2014 | Haba et al. |
| 8,680,684 B2 | 3/2014 | Haba et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson et al. |
| 8,772,817 B2 | 7/2014 | Yao |
| 8,791,575 B2 | 7/2014 | Oganesian et al. |
| 8,836,136 B2 | 9/2014 | Chau et al. |
| 8,841,765 B2 | 9/2014 | Haba et al. |
| 8,847,376 B2 | 9/2014 | Oganesian et al. |
| 8,878,353 B2 | 11/2014 | Haba et al. |
| 8,907,466 B2 | 12/2014 | Haba |
| 8,907,500 B2 | 12/2014 | Haba et al. |
| 8,922,005 B2 | 12/2014 | Hu et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,963,339 B2 | 2/2015 | He et al. |
| 8,975,726 B2 | 3/2015 | Chen |
| 8,981,559 B2 | 3/2015 | Hsu et al. |
| 8,987,132 B2 | 3/2015 | Gruber et al. |
| 9,006,031 B2 | 4/2015 | Camacho et al. |
| 9,041,227 B2 | 5/2015 | Chau et al. |
| 9,054,095 B2 | 6/2015 | Pagaila |
| 9,093,435 B2 | 7/2015 | Sato et al. |
| 9,095,074 B2 | 7/2015 | Haba et al. |
| 9,105,483 B2 | 8/2015 | Chau et al. |
| 9,123,664 B2 | 9/2015 | Haba |
| 9,136,254 B2 | 9/2015 | Zhao et al. |
| 9,153,562 B2 | 10/2015 | Haba et al. |
| 9,196,586 B2 | 11/2015 | Chen et al. |
| 9,214,434 B1 | 12/2015 | Kim et al. |
| 9,224,717 B2 | 12/2015 | Sato et al. |
| 9,258,922 B2 | 2/2016 | Chen et al. |
| 9,263,394 B2 | 2/2016 | Uzoh et al. |
| 9,299,670 B2 | 3/2016 | Yap et al. |
| 9,318,452 B2 | 4/2016 | Chen et al. |
| 9,324,696 B2 | 4/2016 | Choi et al. |
| 9,362,161 B2 | 6/2016 | Chi et al. |
| 9,379,074 B2 | 6/2016 | Uzoh et al. |
| 2001/0002607 A1 | 6/2001 | Sugiura et al. |
| 2001/0006252 A1 | 7/2001 | Kim et al. |
| 2001/0007370 A1 | 7/2001 | Distefano |
| 2001/0021541 A1 | 9/2001 | Akram et al. |
| 2001/0028114 A1 | 10/2001 | Hosomi |
| 2001/0029119 A1* | 10/2001 | Chung .................. H01Q 1/38 439/91 |
| 2001/0042925 A1 | 11/2001 | Yamamoto et al. |
| 2001/0045012 A1 | 11/2001 | Beaman et al. |
| 2001/0048151 A1 | 12/2001 | Chun |
| 2002/0014004 A1 | 2/2002 | Beaman et al. |
| 2002/0066952 A1 | 6/2002 | Taniguchi et al. |
| 2002/0117330 A1 | 8/2002 | Eldridge et al. |
| 2002/0125571 A1 | 9/2002 | Corisis et al. |
| 2002/0153602 A1 | 10/2002 | Tay et al. |
| 2002/0164838 A1 | 11/2002 | Moon et al. |
| 2002/0171152 A1 | 11/2002 | Miyazaki |
| 2002/0185735 A1 | 12/2002 | Sakurai et al. |
| 2002/0190738 A1 | 12/2002 | Beaman et al. |
| 2003/0002770 A1 | 1/2003 | Chakravorty et al. |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0094700 A1 | 5/2003 | Aiba et al. |
| 2003/0106213 A1 | 6/2003 | Beaman et al. |
| 2003/0124767 A1 | 7/2003 | Lee et al. |
| 2003/0162378 A1 | 8/2003 | Mikami |
| 2003/0164540 A1 | 9/2003 | Lee et al. |
| 2004/0014309 A1 | 1/2004 | Nakanishi |
| 2004/0036164 A1 | 2/2004 | Koike et al. |
| 2004/0038447 A1 | 2/2004 | Corisis et al. |
| 2004/0041757 A1 | 3/2004 | Yang et al. |
| 2004/0075164 A1 | 4/2004 | Pu et al. |
| 2004/0090756 A1 | 5/2004 | Ho et al. |
| 2004/0110319 A1 | 6/2004 | Fukutomi et al. |
| 2004/0119152 A1 | 6/2004 | Karnezos et al. |
| 2004/0124518 A1 | 7/2004 | Karnezos |
| 2004/0148773 A1 | 8/2004 | Beaman et al. |
| 2004/0152292 A1 | 8/2004 | Babinetz et al. |
| 2004/0160751 A1 | 8/2004 | Inagaki et al. |
| 2004/0188499 A1 | 9/2004 | Nosaka |
| 2004/0262728 A1 | 12/2004 | Sterrett et al. |
| 2004/0262734 A1 | 12/2004 | Yoo |
| 2005/0017369 A1 | 1/2005 | Clayton et al. |
| 2005/0035440 A1 | 2/2005 | Mohammed |
| 2005/0062173 A1 | 3/2005 | Vu et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0116326 A1 | 6/2005 | Haba et al. |
| 2005/0121764 A1 | 6/2005 | Mallik et al. |
| 2005/0133916 A1 | 6/2005 | Karnezos |
| 2005/0133932 A1 | 6/2005 | Pohl et al. |
| 2005/0140265 A1 | 6/2005 | Hirakata |
| 2005/0146008 A1 | 7/2005 | Miyamoto et al. |
| 2005/0151235 A1 | 7/2005 | Yokoi |
| 2005/0151238 A1 | 7/2005 | Yamunan |
| 2005/0173805 A1 | 8/2005 | Damberg et al. |
| 2005/0173807 A1 | 8/2005 | Zhu et al. |
| 2005/0181544 A1 | 8/2005 | Haba et al. |
| 2005/0181655 A1 | 8/2005 | Haba et al. |
| 2005/0212109 A1 | 9/2005 | Cherukuri et al. |
| 2005/0253213 A1 | 11/2005 | Jiang et al. |
| 2005/0266672 A1 | 12/2005 | Jeng et al. |
| 2005/0285246 A1 | 12/2005 | Haba et al. |
| 2006/0118641 A1 | 6/2006 | Hwang et al. |
| 2006/0166397 A1 | 7/2006 | Lau et al. |
| 2006/0197220 A1 | 9/2006 | Beer |
| 2006/0255449 A1 | 11/2006 | Lee et al. |
| 2006/0278682 A1 | 12/2006 | Lange et al. |
| 2006/0278970 A1 | 12/2006 | Yano et al. |
| 2007/0010086 A1 | 1/2007 | Hsieh |
| 2007/0015353 A1 | 1/2007 | Craig et al. |
| 2007/0035015 A1 | 2/2007 | Hsu |
| 2007/0045803 A1 | 3/2007 | Ye et al. |
| 2007/0080360 A1 | 4/2007 | Mirsky et al. |
| 2007/0090524 A1 | 4/2007 | Abbott |

(56) References Cited

U.S. PATENT DOCUMENTS

| | | |
|---|---|---|
| 2007/0148822 A1 | 6/2007 | Haba et al. |
| 2007/0181989 A1 | 8/2007 | Corisis et al. |
| 2007/0190747 A1 | 8/2007 | Humpston et al. |
| 2007/0235850 A1 | 10/2007 | Gerber et al. |
| 2007/0235856 A1 | 10/2007 | Haba et al. |
| 2007/0241437 A1 | 10/2007 | Kagaya et al. |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0029849 A1 | 2/2008 | Hedler et al. |
| 2008/0032519 A1 | 2/2008 | Murata |
| 2008/0047741 A1 | 2/2008 | Beaman et al. |
| 2008/0048309 A1 | 2/2008 | Corisis et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0073771 A1 | 3/2008 | Seo et al. |
| 2008/0076208 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0211084 A1 | 9/2008 | Chow et al. |
| 2008/0237310 A1* | 10/2008 | Periaman ............... H01L 24/73 228/180.5 |
| 2008/0277772 A1 | 11/2008 | Groenhuis et al. |
| 2008/0280393 A1 | 11/2008 | Lee et al. |
| 2008/0284001 A1 | 11/2008 | Mori et al. |
| 2008/0284045 A1 | 11/2008 | Gerber et al. |
| 2008/0303132 A1 | 12/2008 | Mohammed et al. |
| 2008/0303153 A1 | 12/2008 | Oi et al. |
| 2008/0308305 A1 | 12/2008 | Kawabe |
| 2008/0315385 A1 | 12/2008 | Gerber et al. |
| 2009/0014876 A1 | 1/2009 | Youn et al. |
| 2009/0026609 A1 | 1/2009 | Masuda |
| 2009/0032913 A1 | 2/2009 | Haba |
| 2009/0045497 A1 | 2/2009 | Kagaya et al. |
| 2009/0050994 A1 | 2/2009 | Ishihara et al. |
| 2009/0085185 A1 | 4/2009 | Byun et al. |
| 2009/0085205 A1 | 4/2009 | Sugizaki |
| 2009/0091009 A1 | 4/2009 | Corisis et al. |
| 2009/0091022 A1 | 4/2009 | Meyer et al. |
| 2009/0102063 A1 | 4/2009 | Lee et al. |
| 2009/0104736 A1 | 4/2009 | Haba et al. |
| 2009/0115044 A1 | 5/2009 | Hoshino et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0146301 A1 | 6/2009 | Shimizu et al. |
| 2009/0146303 A1 | 6/2009 | Kwon |
| 2009/0160065 A1 | 6/2009 | Haba et al. |
| 2009/0166664 A1 | 7/2009 | Park et al. |
| 2009/0189288 A1 | 7/2009 | Beaman et al. |
| 2009/0206461 A1 | 8/2009 | Yoon |
| 2009/0212442 A1 | 8/2009 | Chow et al. |
| 2009/0236700 A1 | 9/2009 | Moriya |
| 2009/0236753 A1 | 9/2009 | Moon et al. |
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0044860 A1 | 2/2010 | Haba et al. |
| 2010/0052135 A1 | 3/2010 | Shim et al. |
| 2010/0052187 A1 | 3/2010 | Lee et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0148360 A1 | 6/2010 | Lin et al. |
| 2010/0193937 A1 | 8/2010 | Nagamatsu et al. |
| 2010/0200981 A1 | 8/2010 | Huang et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0246141 A1 | 9/2010 | Leung et al. |
| 2010/0258928 A1* | 10/2010 | Chi ..................... H01L 23/3677 257/686 |
| 2010/0289142 A1 | 11/2010 | Shim et al. |
| 2010/0314748 A1 | 12/2010 | Hsu et al. |
| 2010/0320585 A1 | 12/2010 | Jiang et al. |
| 2010/0327419 A1 | 12/2010 | Muthukumar et al. |
| 2011/0042699 A1 | 2/2011 | Park et al. |
| 2011/0057308 A1 | 3/2011 | Choi et al. |
| 2011/0068453 A1 | 3/2011 | Cho et al. |
| 2011/0068478 A1 | 3/2011 | Pagaila et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0157834 A1 | 6/2011 | Wang |
| 2011/0175213 A1 | 7/2011 | Mori et al. |
| 2011/0220395 A1 | 9/2011 | Cho et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2011/0272798 A1 | 11/2011 | Lee et al. |
| 2012/0007232 A1 | 1/2012 | Haba |
| 2012/0015481 A1 | 1/2012 | Kim |
| 2012/0018885 A1 | 1/2012 | Lee et al. |
| 2012/0025365 A1 | 2/2012 | Haba |
| 2012/0038064 A1* | 2/2012 | Camacho ................ H01L 24/29 257/777 |
| 2012/0043655 A1 | 2/2012 | Khor et al. |
| 2012/0056312 A1 | 3/2012 | Pagaila et al. |
| 2012/0056316 A1* | 3/2012 | Pagaila .................. H01L 25/16 257/737 |
| 2012/0061814 A1 | 3/2012 | Camacho et al. |

(56) References Cited

U.S. PATENT DOCUMENTS

| | | | |
|---|---|---|---|
| 2012/0063090 A1 | 3/2012 | Hsiao et al. |
| 2012/0074585 A1 | 3/2012 | Koo et al. |
| 2012/0080787 A1 | 4/2012 | Shah et al. |
| 2012/0086111 A1 | 4/2012 | Iwamoto et al. |
| 2012/0086130 A1 | 4/2012 | Sasaki et al. |
| 2012/0104595 A1 | 5/2012 | Haba et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2013/0009303 A1 | 1/2013 | Tsai et al. |
| 2013/0032944 A1 | 2/2013 | Sato et al. |
| 2013/0049218 A1 | 2/2013 | Gong et al. |
| 2013/0049221 A1 | 2/2013 | Han et al. |
| 2013/0069222 A1 | 3/2013 | Camacho |
| 2013/0105979 A1 | 5/2013 | Yu et al. |
| 2013/0134588 A1 | 5/2013 | Yu et al. |
| 2013/0200524 A1 | 8/2013 | Han et al. |
| 2013/0234317 A1 | 9/2013 | Chen et al. |
| 2013/0241083 A1 | 9/2013 | Yu et al. |
| 2014/0021605 A1 | 1/2014 | Yu et al. |
| 2014/0035892 A1 | 2/2014 | Shenoy et al. |
| 2014/0036454 A1 | 2/2014 | Caskey et al. |
| 2014/0077364 A1 | 3/2014 | Marimuthu et al. |
| 2014/0103527 A1 | 4/2014 | Marimuthu et al. |
| 2014/0124949 A1 | 5/2014 | Paek et al. |
| 2014/0124955 A1 | 5/2014 | Chen et al. |
| 2014/0145325 A1 | 5/2014 | Magnus et al. |
| 2014/0175657 A1 | 6/2014 | Oka et al. |
| 2014/0248742 A1 | 9/2014 | Gonzalez et al. |
| 2014/0312503 A1 | 10/2014 | Seo |
| 2014/0367160 A1 | 12/2014 | Yu et al. |
| 2015/0017765 A1 | 1/2015 | Co et al. |
| 2015/0044823 A1 | 2/2015 | Mohammed |
| 2015/0123268 A1 | 5/2015 | Yu et al. |
| 2015/0206865 A1 | 7/2015 | Yu et al. |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11-260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 200447702 | 2/2004 |
| JP | 2004047702 A | 2/2004 |
| JP | 2004-172157 A | 6/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009-508324 A | 2/2009 |
| JP | 2009044110 A | 2/2009 |
| JP | 2009506553 | 2/2009 |
| JP | 2009528706 A | 8/2009 |
| JP | 2009260132 A | 11/2009 |
| JP | 2010103129 A | 5/2010 |
| JP | 2010192928 A | 9/2010 |
| JP | 2010199528 A | 9/2010 |
| JP | 2010206007 A | 9/2010 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 10-2007-0058680 A | 6/2007 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |

(56) References Cited

FOREIGN PATENT DOCUMENTS

| WO | 2012067177 A1 | 5/2012 |
|---|---|---|
| WO | 2013059181 A1 | 4/2013 |
| WO | 2013065895 A1 | 5/2013 |
| WO | 2014107301 A1 | 7/2014 |

OTHER PUBLICATIONS

Brochure, "Invensas BVA PoP for Mobile Computing: Ultra-High IO without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
"3D Plus Wafer Level Stack," EE Times Asia [online]. [Retrieved Aug. 5, 2010]. Retrieved from internet. <http://www.eetasia.com/ART_8800428222_480300_nt_dec52276.HTM>, 4 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
Bang, U.S. Appl. No. 10/656,534, filed Sep. 5, 2003.
Chinese Office Action for Application No. 201180022247.8 dated Apr. 14, 2015.
Chinese Office Action for Application No. 201180022247.8 dated Sep. 16, 2014.
Chinese Office Action for Application No. 201310264264.3 dated May 12, 2015.
Extended European Search Report for Application No. EP13162975 dated Sep. 5, 2013.
International Search Report and Written Opinion for Application No. PCT/US2011/024143 dated Jan. 17, 2012.
International Search Report and Written Opinion for Application No. PCT/US2011/044346 dated May 11, 2012.
International Search Report and Written Opinion for Application No. PCT/US2012/060402 dated Apr. 2, 2011.
International Search Report and Written Opinion for Application No. PCT/US2013/026126 dated Jul. 25, 2013.
International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
International Search Report and Written Opinion for Application No. PCT/US2013/075672 dated Apr. 22, 2014.
International Search Report and Written Opinion for Application No. PCT/US2015/011715 dated Apr. 20, 2015.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Japanese Office Action for Application No. 2013-509325 dated Oct. 18, 2013.
Japanese Office Action for Application No. 2013-520776 dated Apr. 21, 2015.
Japanese Office Action for Application No. 2013-520777 dated May 22, 2015.
Jin, Yonggang et al., "STM 3D-IC Package and 3D eWLB Development," STMicroelectronics Singapore/STMicroelectronics France, May 21, 2010.
Kim et al., "Application of Through Mold Via (TMV) as PoP base package", 6 pages (2008).
Korean Office Action for Application No. 10-2011-0041843 dated Jun. 20, 2011.
Korean Office Action for Application No. 2014-7025992 dated Feb. 5, 2015.
Korean Search Report KR10-2011-0041843 dated Feb. 24, 2011.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 mailed May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report for Application No. PCT/US2015/033004 dated Sep. 9, 2015.
Partial International Search Report from Invitation to Pay Additional Fees for Application No. PCT/US2012/028738 lated Jun. 6, 2012.
Redistributed Chip Package (RCP) Technology, Freescale Semiconductor, 2005, 6 pages.
Search Report from Korean Patent Application No. 10-2010-0113271 dated Jan. 12, 2011.
Taiwanese Office Action for Application No. 102106326 dated Sep. 8, 2015.
Taiwanese Office Action for Application No. 100140428 dated Jan. 26, 2015.
Taiwanese Office Action for Application No. 100141695 dated Mar. 19, 2014.
Taiwanese Office Action for Application No. 101138311 dated Jun. 27, 2014.
Yoon, PhD, Seung Wook, "Next Generation Wafer Level Packaging Solution for 3D integration," May 2010, Stats ChipPAC Ltd.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2014/055695, dated Dec. 15, 2015.
International Search Report and Written Opinion for Appln. No. PCT/US2016/056402, dated Jan. 31, 2017.
NTK HTCC Package General Design Guide, Communication Media Components Group, NGK Spark Plug Co., Ltd., Komaki, Aichi, Japan, Apr. 2010, 32 pages.
Partial International Search Report for Appln. No. PCT/US2014/014181, dated May 8, 2014.
Taiwan Office Action for 103103350, dated Mar. 21, 2016.
U.S. Appl. No. 13/477,532, mailed May 22, 2012.
Written Opinion for Appln. No. PCT/US2014/050125, dated Jul. 15, 2015.

* cited by examiner

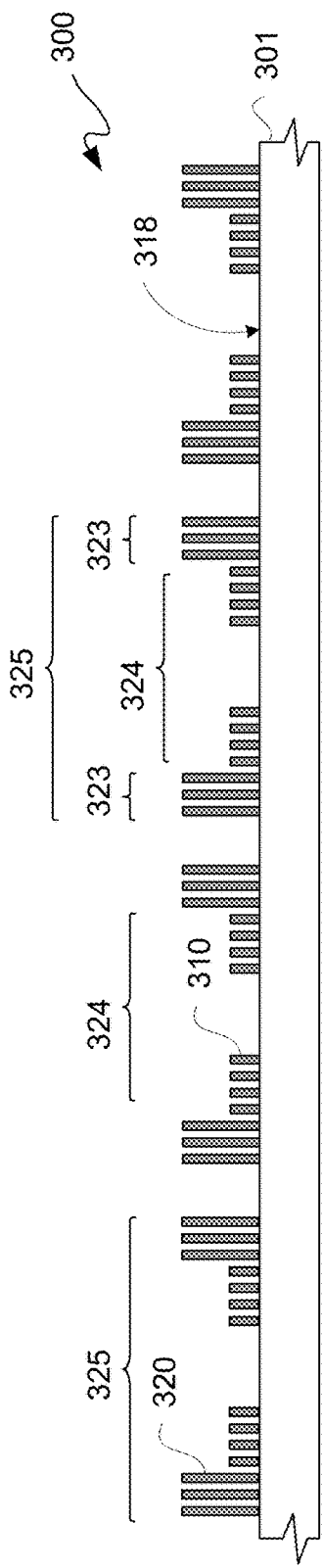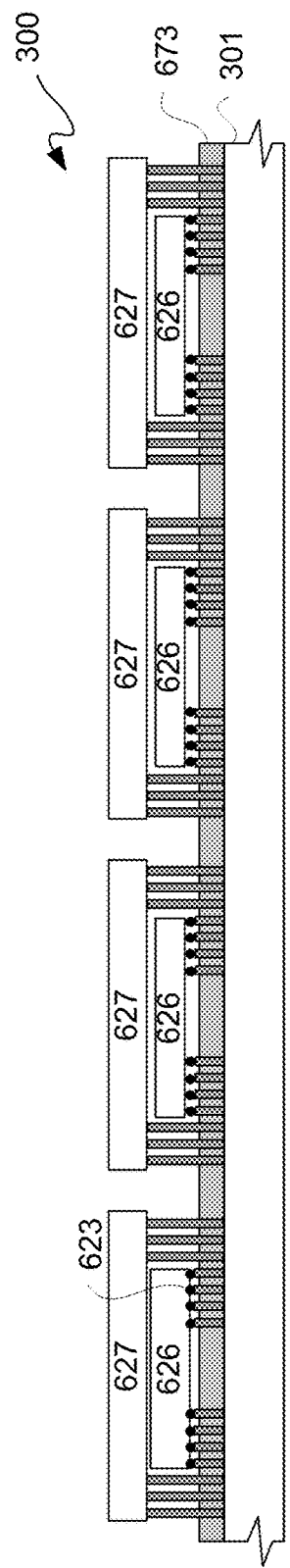

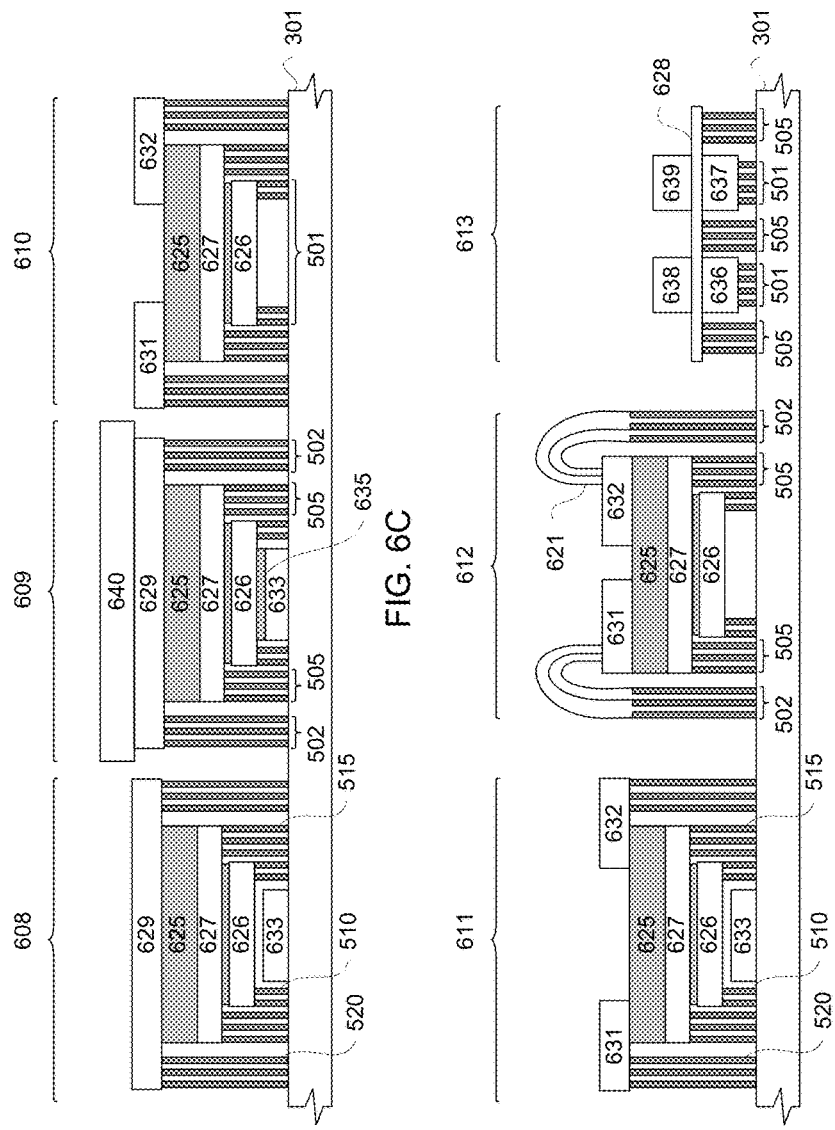

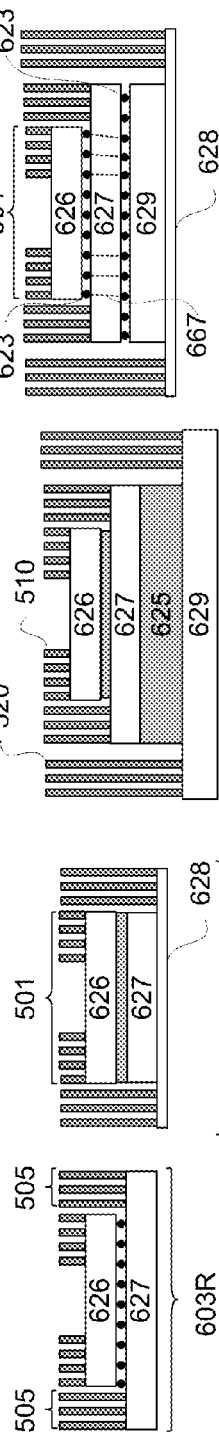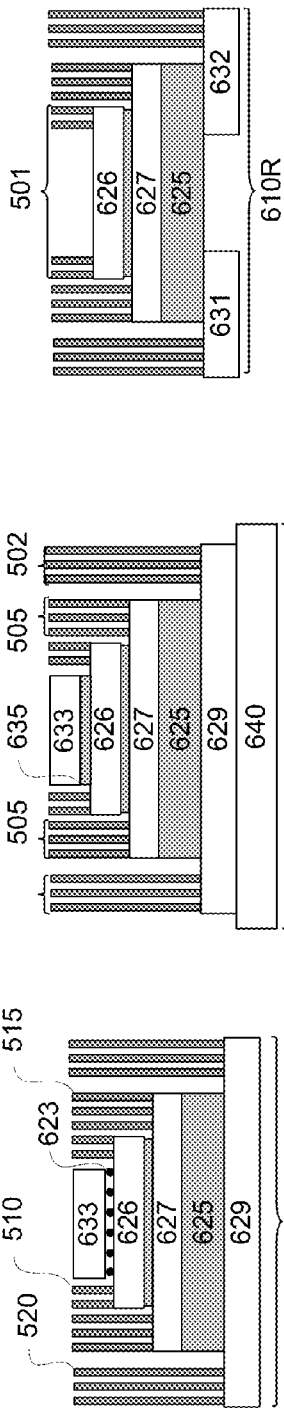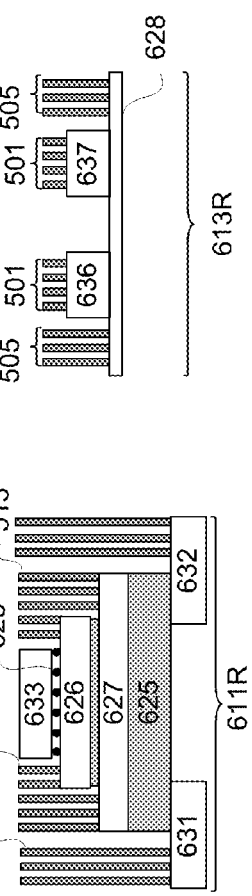

MULTIPLE BOND VIA ARRAYS OF DIFFERENT WIRE HEIGHTS ON A SAME SUBSTRATE

CROSS-REFERENCE TO RELATED APPLICATION(S)

This application is a divisional of, and hereby claims priority to, pending U.S. patent application Ser. No. 14/087,252, filed on Nov. 22, 2013, the entirety of which is hereby incorporated by reference herein for all purposes.

FIELD

The following description relates to integrated circuits ("ICs"). More particularly, the following description relates to multiple bond via arrays of different wire heights on a same substrate for an IC package.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be an IC, and an interposer may be a passive or an active IC, where the latter includes one or more active devices, such as transistors for example, and the former does not include any active device. Furthermore, an interposer may be formed like a PWB, namely without any circuit elements such as capacitors, resistors, or active devices. Additionally, an interposer includes at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC. Additionally, a redistribution layer ("RDL") may be part of an IC to facilitate a flip-chip configuration, die stacking, or more convenient or accessible position of bond pads for example. Conventional interconnecting of an IC to another IC or to a circuit platform has issues with solder bridging.

Accordingly, it would be desirable and useful to provide a structure for interconnection of an IC that mitigates against solder bridging.

BRIEF SUMMARY

An apparatus relates generally to a substrate. In such an apparatus, a first bond via array has first wires extending from a surface of the substrate. A second bond via array has second wires extending from the surface of the substrate. The first bond via array is disposed at least partially within the second bond via array. The first wires of the first bond via array are of a first height. The second wires of the second bond via array are of a second height greater than the first height for coupling of at least one die to the first bond via array at least partially disposed within the second bond via array.

A method relates generally to forming interconnect structures. In such a method, a substrate is obtained. A first bond via array with first wires is formed extending from a surface of the substrate. A second bond via array with second wires is formed extending from the surface of the substrate. The first bond via array is at least partially disposed within the second bond via array. The first wires of the first bond via array are of a first height. The second wires of the second bond via array are of a second height greater than the first height for a package-on-package configuration.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 3A through 3M are respective block diagrams of side views depicting an exemplary portion of a process flow for processing a substrate to provide such substrate with two or more bond via arrays with wires of different heights.

FIGS. 6A through 6D are block diagrams of side views of exemplary package-on-package assemblies ("die stacks") assembled using a substrate having two or more bond via arrays with wires of different heights.

FIGS. 6E-1 through 6E-9 are block diagrams of side views of exemplary package-on-package assemblies ("die stacks"), each of which may have two or more bond via arrays with wires of different heights.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Figure 1A:
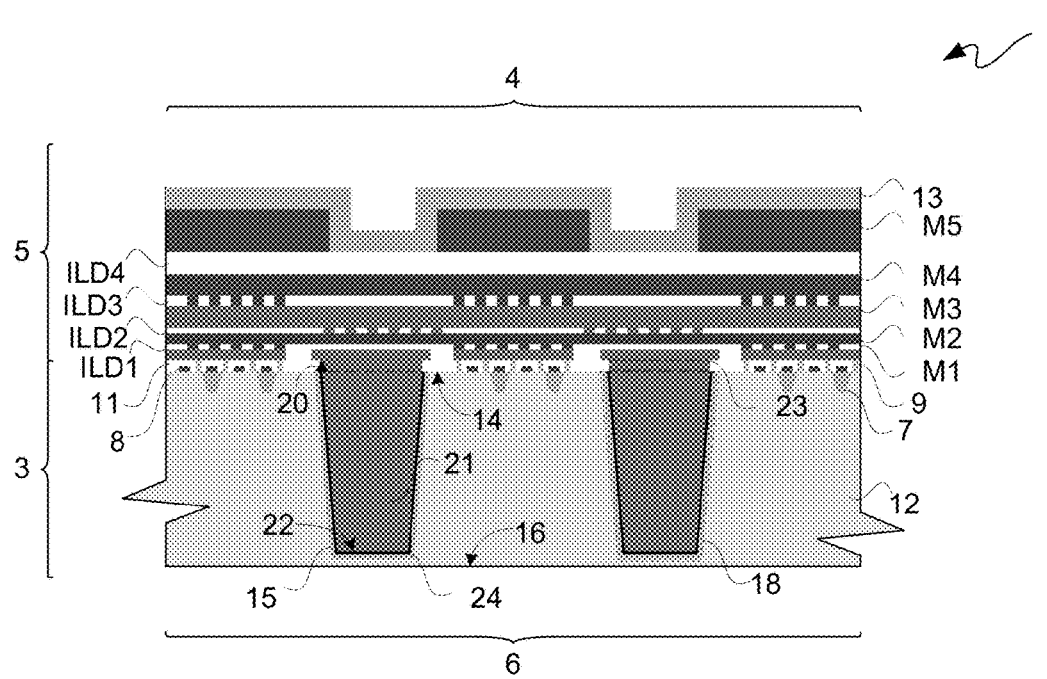
FIG. 1A is a schematic diagram of a cross-sectional view depicting an exemplary portion of an in-process wafer for providing an integrated circuit ("IC").

The following description generally relates to two or more bond via arrays ("BVAs") on a same surface of a substrate. At least two of these bond via arrays have wires of distinctly different heights for accommodation of die stacking within at least one of such bond via arrays and in some applications vias or wires may have different electrical resistivities and/or elastic moduli FIG. 1A is a schematic diagram of a cross-sectional view depicting an exemplary portion of an in-process wafer for providing an IC 10 component. IC 10 includes a substrate 12 of a semiconductor material such as silicon (Si), gallium arsenide (GaAs), polymeric, ceramic, carbon-based substrates such as diamond, a silicon carbon (SiC), germanium (Ge), $Si_{1-x}Ge_x$, or the like. Even though a semiconductor substrate 12 as provided from an in-process wafer is generally described below, any sheet or layer semiconductor material or dielectric material, such as ceramic or glass for example, may be used as a substrate. Furthermore, even though an IC 10 is described, any microelectronic component that includes one or more through-substrate via structures may be used.

Substrate 12 includes an upper surface 14 and a lower surface 16 that extend in lateral directions and are generally parallel to each other at a thickness of substrate 12. Use of terms such as "upper" and "lower" or other directional terms is made with respect to the reference frame of the figures and is not meant to be limiting with respect to potential alternative orientations, such as in further assemblies or as used in various systems.

Upper surface 14 may generally be associated with what is referred to as a "front side" 4 of an in-process wafer, and lower surface 16 may generally be associated with what is referred to as a "backside" 6 of an in-process wafer. Along those lines, a front-side 4 of an in-process wafer may be used for forming what is referred to as front-end-of-line ("FEOL") structures 3 and back-end-of-line ("BEOL") structures 5. Generally, FEOL structures 3 may include shallow trench isolations ("STI") 7, transistor gates 8, transistor source/drain regions (not shown), transistor gate dielectrics (not shown), contact etch stop layer ("CESL"; not shown), a pre-metallization dielectric or pre-metal dielectric ("PMD") 11, and contact plugs 9, among other FEOL structures. A PMD 11 may be composed of one or more layers. Generally, BEOL structures 5 may include one or more inter-level dielectrics ("ILDs") and one or more levels of metallization ("M"). In this example, there are four ILDs, namely ILD1, ILD2, ILD3, and ILD4; however, in other configurations there may be fewer or more ILDs. Furthermore, each ILD may be composed of one or more dielectric layers. In this example, there are five levels of metallization, namely M1, M2, M3, M4, and M5; however, in other configurations there may be fewer or more levels of metallization. Additionally, metal from a metallization level may extend through one or more ILDs, as is known. Furthermore, each level of metallization may be composed of one or more metal layers. A passivation level 13 may be formed on a last metallization layer. Such passivation level 13 may include one or more dielectric layers, and further may include an anti-reflective coating ("ARC"). Furthermore, a redistribution layer ("RDL") may be formed on such passivation level. Conventionally, an RDL may include: a dielectric layer, such as a polyimide layer for example; another metal layer on such dielectric layer and connected to a bond pad of a metal layer of a last metallization level; and another dielectric layer, such as another polyimide layer for example, over such RDL metal layer while leaving a portion thereof exposed to provide another bond pad. A terminal opening may expose such other bond pad of such RDL metal layer. Thereafter, a solder bump or wire bond may be conventionally coupled to such bond pad.

As part of a FEOL or BEOL structure formation, a plurality of via structures 18 may extend within openings formed in substrate 12 which extend into substrate 12. Via structures 18 may be generally in the form of any solid of any shape formed by filling an opening formed in substrate 12. Examples of such solid shapes generally include cylindrical, conical, frustoconical, rectangular prismatic, cubic, or the like. Examples of openings for via structures, vias, and processes for the fabrication thereof, may be found in U.S. patent application Ser. No. 13/193,814 filed Jul. 29, 2011 (now U.S. Pat. No. 8,816,505), and U.S. patent application Ser. Nos. 12/842,717 and 12/842,651 both filed on Jul. 23, 2010 (now U.S. Pat. Nos. 8,791,575 and 8,796,135, respectively), and each of these patent applications is hereby incorporated by reference herein for all purposes to the extent same is consistent with the description hereof.

Conventionally, via structures 18 may extend from upper surface 14 down toward lower surface 16, and after a backside reveal, via structures 18 may extend between surfaces 14 and 16, as effectively thickness of substrate 12 may be thinned so as to reveal lower end surfaces of via structures 18, as described below in additional detail. Via structures 18 extending through substrate 12 between surfaces 14 and 16, though they may extend above or below such surfaces, respectively, may be referred to as through-substrate-vias. As substrates are often formed of silicon, such through-substrate-vias are commonly referred to as TSVs, which stands for through-silicon-vias.

Such openings formed in substrate 12 may be conformally coated, oxidized, or otherwise lined with a liner or insulator 15. Conventionally, liner 15 is silicon dioxide; however, a silicon oxide, a silicon nitride, or another dielectric material may be used to electrically isolate via structures 18 from substrate 12. Generally, liner 15 is an insulating or dielectric material positioned between any and all conductive portions of a via structure 18 and substrate 12 such that an electronic signal, a ground, a supply voltage, or the like carried by such via structure 18 is not substantially leaked into substrate 12, which may cause signal loss or attenuation, shorting, or other circuit failure.

Overlying a liner 15 may be a barrier layer 24. Generally, barrier layer 24 is to provide a diffusion barrier with respect to a metallic material used to generally fill a remainder of an opening in which a via structure 18 is formed. Barrier layer 24 may be composed of one or more layers. Furthermore, a barrier layer 24 may provide a seed layer for subsequent electroplating or other deposition, and thus barrier layer 24 may be referred to as a barrier/seed layer. Moreover, barrier layer 24 may provide an adhesion layer for adherence of a subsequently deposited metal. Thus, barrier layer 24 may be a barrier/adhesion layer, a barrier/seed layer, or a barrier/adhesion/seed layer. Examples of materials that may be used for barrier layer 24 include tantalum (Ta), tantalum nitride (TaN), palladium (Pd), titanium nitride (TiN), TaSiN, compounds of Ta, compounds of Ti, compounds of nickel (Ni), compounds of copper (Cu), compounds of cobalt (Co), or compounds of tungsten (W), among others.

Via structures 18 may generally consist of a metallic or other conductive material generally filling a remaining void in an opening formed in substrate 12 to provide a via conductor 21. In various examples, a via conductor 21 of a via structure 18 may generally consist of copper or a copper alloy. However, a via conductor 21 may additionally or alternatively include one or more other conductive materials such as tantalum, nickel, titanium, molybdenum, tungsten, aluminum, gold, or silver, including various alloys or compounds of one or more of the these materials, and the like. A via conductor 21 may include non-metallic additives to control various environmental or operational parameters of a via structure 18.

Via structures 18 may each include an upper end contact surface 20 which may be level with upper surface 14 of substrate 12 and a lower end contact surface 22 which may be level with lower surface 16 of substrate 12 after a backside reveal. End surfaces 20 and 22 may be used to interconnect via structures 18 with other internal or external components, as below described in additional detail.

In this example, upper end contact surface 20 of via conductors 21 are interconnected to M1 through a respective contact pad 23. Contact pads 23 may be formed in respective openings formed in PMD 11 in which M1 extends. However, in other configurations, one or more via conductors 21 may extend to one or more other higher levels of metallization through one or more ILDs. Furthermore, via structure 18 is what may be referred to as a front side TSV, as an opening used to form via structure is initially formed by etching from a front side of substrate 12.

Figure 1B:
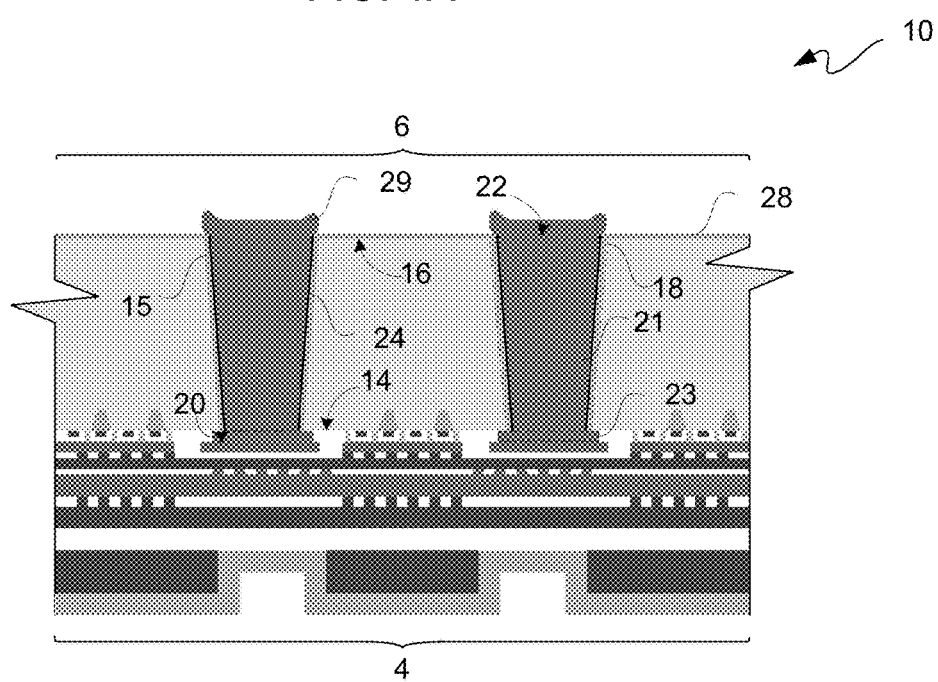
FIG. 1B is a schematic diagram of a cross-sectional view depicting an exemplary portion of an in-process wafer for providing another IC.

However, a via structure may be a backside TSV, as generally indicated in FIG. 1B, where there is shown a schematic diagram of a cross-sectional view depicting an exemplary portion of an in-process wafer for providing another IC 10. Fabrication of a backside TSV is generally referred to as a "via last approach," and accordingly fabrication of a front side TSV is generally referred to as a "via first approach."

IC 10 of FIG. 1B includes a plurality of via structures 18, which are backside TSVs. For a backside TSV for via structure 18, liner 15 may be a deposited polymer into a "donut" silicon trench etch and deposited on lower surface 16 as a passivation layer 28, followed by a central silicon trench etch to remove an inner portion of the "donut" silicon trench, and followed by a seed layer deposition before patterning and electroplating to provide via conductors 21 having respective solder bump pads or landings 29. Optionally, a conventional anisotropic silicon etch may be used prior to depositing and patterning a polymer isolation layer as liner 15.

For purposes of clarity by way of example and not limitation, it shall be assumed that front side TSVs are used, as the following description is generally equally applicable to backside TSVs.

Figure 1C:
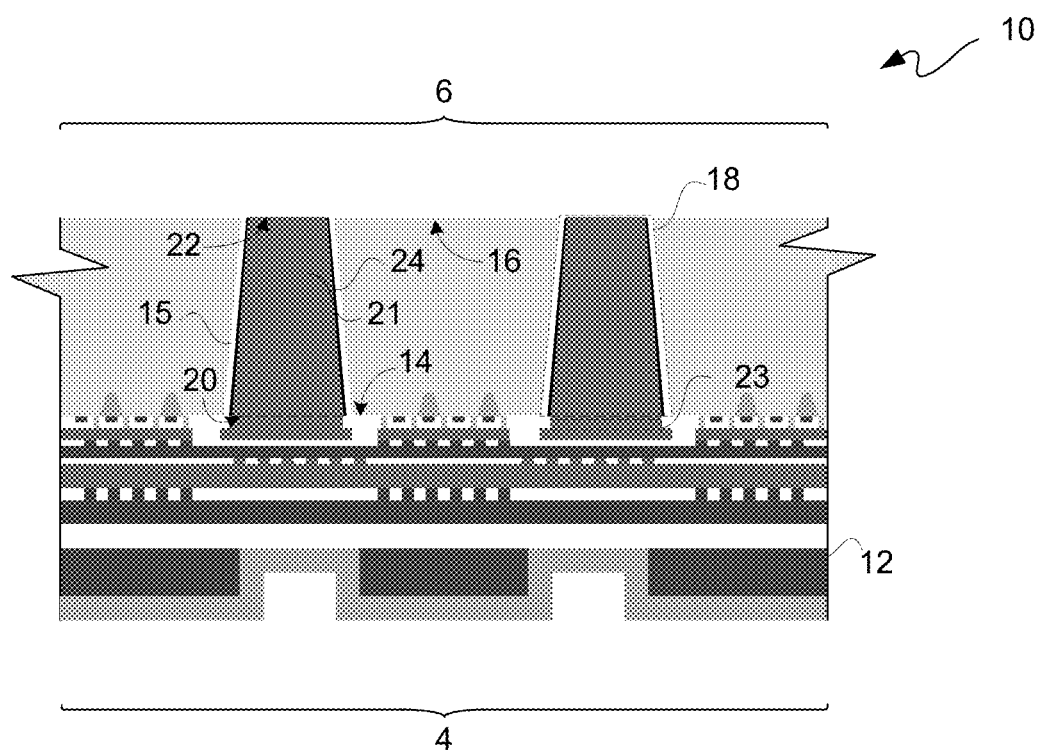
FIG. 1C is the diagram of FIG. 1A with the IC vertically flipped after chemical-mechanical-polishing of a lower surface of a substrate of the IC.

FIG. 1C is the diagram of FIG. 1A with IC 10 after a chemical-mechanical-polishing ("CMP") of a lower surface 16 of a substrate 12. Such CMP may be performed to temporarily reveal lower end contact surface 22, and thus portions of liner 15 and barrier layer 24 previously underlying lower end contact surface 22 may be removed by CMP. Thus, in this example, lower end contact surface 22 may be coplanar and level with lower surface 16.

Figure 1D:
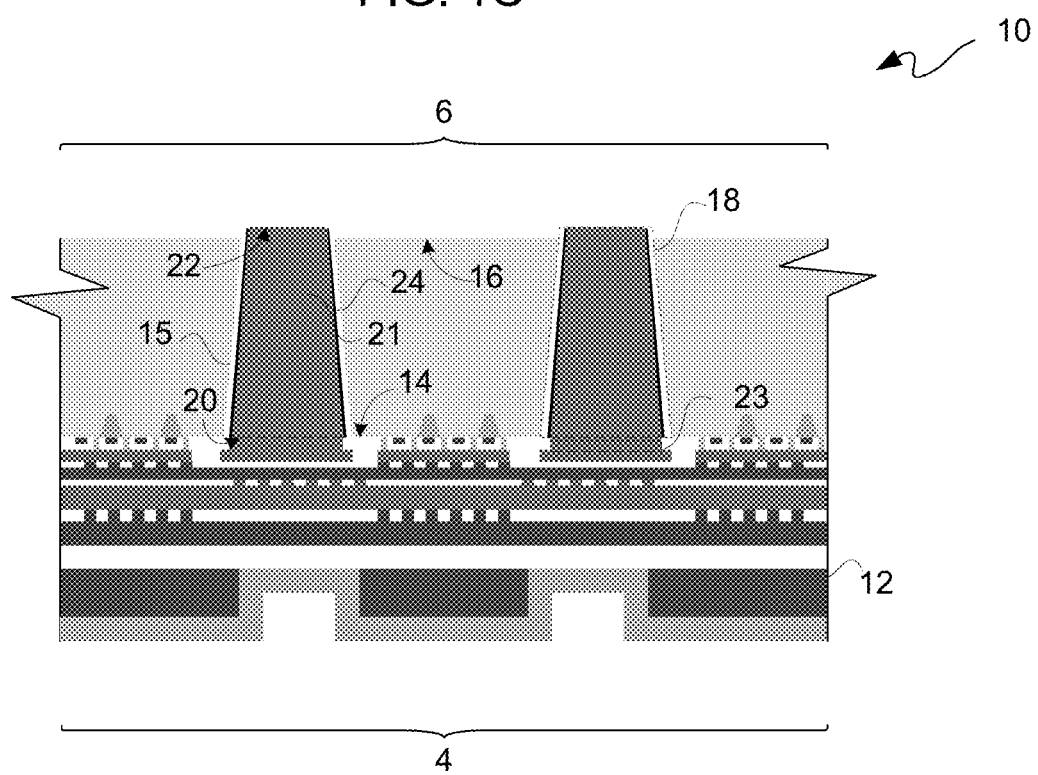
FIG. 1D is the diagram of FIG. 1A with the IC vertically flipped after a backside etch of a lower surface of a substrate of the IC to reveal a lower end contact surface of a via conductor thereof.

FIG. 1D is the diagram of FIG. 1A with IC 10 after a backside etch of a lower surface 16 of substrate 12 to temporarily reveal a lower end contact surface 22 of a via conductor 21. In this example, lower end contact surface 22 may be coplanar with lower surface 16; however, as via conductor 21, and optionally barrier layer 24, may protrude from substrate 12 after a backside reveal etch, lower end contact surface 22 in this example is not level with lower surface 16. For purposes of clarity and not limitation, IC 10 of FIG. 1D shall be further described, as the following description may likewise apply to IC 10 of FIG. 1C.

Figure 1E:
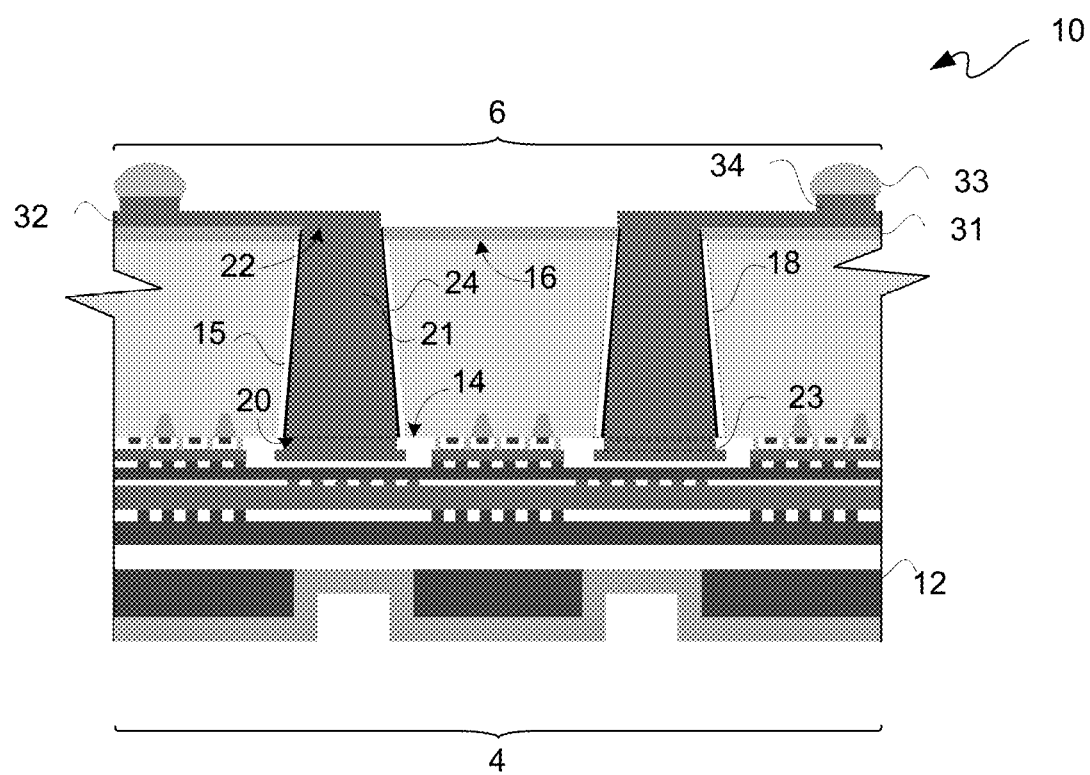
FIG. 1E is the diagram of FIG. 1D with a lower surface of the IC having formed thereon a passivation layer, which may be formed of one or more dielectric layers.

FIG. 1E is the diagram of FIG. 1D with a lower surface 16 of a substrate 12 having formed thereon a passivation layer 31, which may be formed of one or more dielectric layers. Furthermore, passivation layer 31 may be a polymer layer. For example, passivation layer 31 may be a benzocyclobutene ("BCB") layer or a combination of a silicon nitride layer and a BCB layer. In some applications, passivation layer 31 may be referred to as an inter-die layer. A metal layer 32, such as a copper, copper alloy, or other metal previously described, may be formed on passivation layer 31 and on lower end contact surfaces 22 of via conductors 21. This metal layer 32 may be an RDL metal layer. Balls 33 may be respectively formed on bonding pads 34, where such pads may be formed on or as part of metal layer 32. Balls 33 may be formed of a bonding material, such as solder or other bonding material. Balls 33 may be microbumps, C4 bumps, ball grid array ("BGA") balls, or some other die interconnect structure. In some applications, metal layer 32 may be referred to as a landing pad.

More recently, TSVs have been used to provide what is referred to as three-dimensional ("3D") ICs or "3D ICs." Generally, attaching one die to another using, in part, TSVs may be performed at a bond pad level or an on-chip electrical wiring level. ICs 10 may be diced from a wafer into single dies. Such single dies may be bonded to one another or bonded to a circuit platform, as previously described. For purposes of clarity by way of example and not limitation, it shall be assumed that an interposer is used for such circuit platform.

Interconnection components, such as interposers, may be in electronic assemblies for a variety of purposes, including facilitating interconnection between components with different connection configurations or to provide spacing between components in a microelectronic assembly, among others. Interposers may include a semiconductor layer, such as of silicon or the like, in the form of a sheet or layer of material or other substrate having conductive elements such as conductive vias extending within openings which extend through such layer of semiconductor material. Such conductive vias may be used for signal transmission through such interposer. In some interposers, ends of such vias may be used as contact pads for connection of such interposer to other microelectronics components. In other examples, one or more RDLs may be formed as part of such interposer on one or more sides thereof and connected with one or both ends of such vias. An RDL may include numerous conductive traces extending on or within one or more dielectric sheets or layers. Such traces may be provided in one level or in multiple levels throughout a single dielectric layer, separated by portions of dielectric material within such RDL. Vias may be included in an RDL to interconnect traces in different levels of such RDL.

Figure 2A:
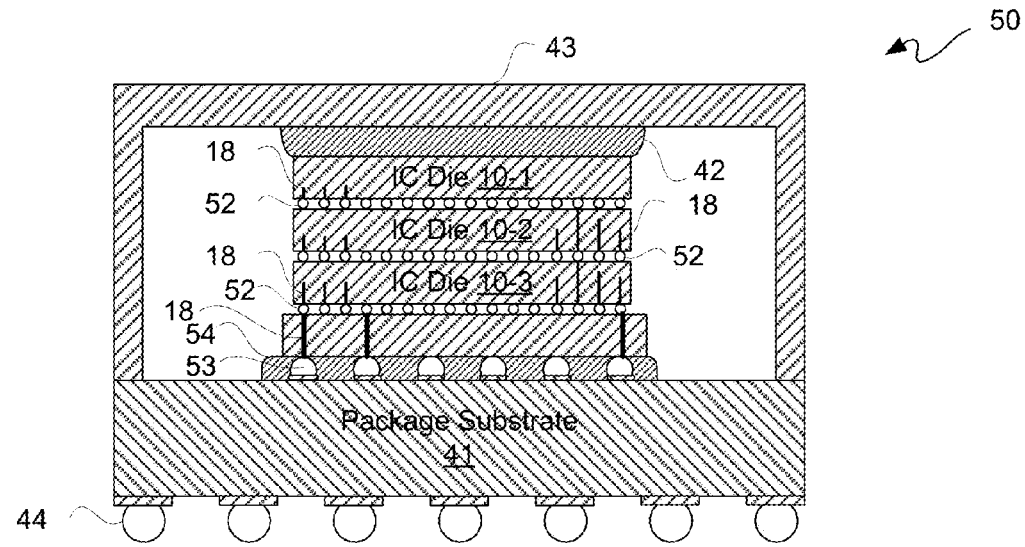
FIG. 2A is a block diagram of a cross-sectional view depicting an exemplary three-dimensional ("3D") IC packaged component with via structures.

FIG. 2A is a block diagram of a cross-sectional view depicting an exemplary 3D IC packaged component 50 with via structures 18. While a stacked die or a package-on-package die may include TSV interconnects, use of via structures 18 for a 3D IC packaged component 50 is described for purposes of clarity by way of example. In this example of a 3D IC packaged component 50, there are three ICs 10, namely ICs 10-1, 10-2, and 10-3, stacked one upon the other. In other implementations, there may be fewer or more than three ICs 10 in a stack. ICs 10 may be bonded to one another using microbumps 52 or flip-chip solder bumps. Optionally, Cu pillars extending from a backside of a die may be used. Some of these microbumps 52 may be interconnected to via structures 18. For example, a Cu/Sn microbump transient liquid phase ("TLP") bonding technology may be used for bonding ICs to one another. Thus, interconnect layers may be on one upper or lower side or both upper and lower sides of an IC 10 of a 3D stack.

A bottom IC 10-3 of such ICs in a 3D stack optionally may be coupled to an interposer or interposer die 40. Interposer 40 may be an active die or a passive die. For purposes of clarity and not limitation, it shall be assumed that interposer 40 is a passive die. IC 10-3 may be coupled to interposer 40 by microbumps 52. Interposer 40 may be coupled to a package substrate. A package substrate may be formed of thin layers called laminates or laminate substrates. Laminates may be organic or inorganic. Examples of materials for "rigid" package substrates include an epoxy-based laminate such as FR4, a resin-based laminate such as bis-maleimide-triazine ("BT"), a ceramic substrate, a glass substrate, or other form of package substrate. An under fill 54 for a flip chip attachment may encapsulate C4 bumps or other solder balls 53 used to couple interposer die 40 and package substrate 41. A spreader/heat sink ("heat sink") 43 may be attached to package substrate 41, and such heat sink 43 and substrate package 41 in combination may encase ICs 10 and interposer 40 of such 3D stack. A thermal paste 42 may couple an upper surface of IC 10-1 on top of such 3D stack to an upper internal surface of such heat sink 43. Ball grid array ("BGA") balls or other array interconnects 44 may be used to couple package substrate 41 to a circuit platform, such as a PCB for example.

Figure 2B:
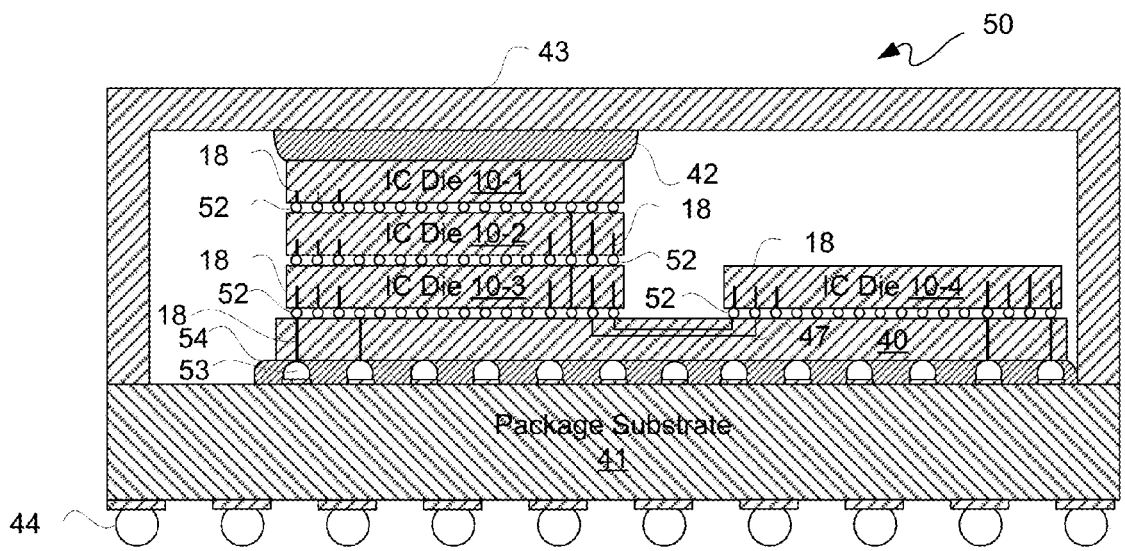
FIG. 2B is a block diagram of a cross-sectional view depicting another exemplary 3D IC packaged component with via structures.

FIG. 2B is a block diagram of a cross-sectional view depicting another exemplary 3D IC packaged component 50 with via structures 18. 3D IC packaged components 50 of FIGS. 2A and 2B are the same except for the following differences; in FIG. 2B, another IC 10-4 is separately coupled via microbumps 52 to interposer 40, where IC 10-4 is not coupled in the stack of ICs 10-1, 10-2, and 10-3. Furthermore, interposer 40 includes metal and via layers for providing wires 47 for interconnecting ICs 10-3 and 10-4. Furthermore, interposer 40 includes via structures 18 coupled to IC 10-4 through microbumps 52.

3D wafer-level packaging ("3D-WLP") may be used for interconnecting two or more ICs, one or more ICs to an interposer, or any combination thereof, where interconnects thereof may use via structures 18. Optionally, ICs may be interconnected die-to-die ("D2D") or chip-to-chip ("C2C"), where interconnects thereof may use via structures 18. Further, optionally, ICs may be interconnected die-to-wafer ("D2W") or chip-to-wafer ("C2W"), where interconnects thereof may use via structures 18. Accordingly, any of a variety of die stacking or chip stacking approaches may be used to provide a 3D stacked IC ("3D-SIC" or "3D-IC").

FIGS. 3A through 3M are respective block diagrams of side views depicting an exemplary portion process flow 300 for processing a substrate 301 to provide a substrate 301 with two or more bond via arrays with wires of different heights. Such wire heights may be sufficiently different for forming package-on-package components with one or more dies stacked within at least one of such bond via arrays. For purposes of clarity by way of example and not limitation, it shall be assumed that substrate 301 includes a fabricated multi-layered structure ("substrate") with generally any and all BEOL and/or FEOL processing operations having been completed. In passive die configurations, such as a passive interposer for example, there may not be any FEOL processing operations. As used above, substrate 12 of FIG. 1A for example was a single layer. However, more generally a substrate 301 may be a single layer or multiple layers used to form a passive or active component. Along those lines, a semiconductor die may be referred to as a substrate 301. Generally, a substrate 301 may be any sheet, wafer or layer of semiconductor material or dielectric material, such as gallium-arsenide, silicon-germanium, ceramic, polymer, polymer composite, glass-epoxy, glass, or other suitable low-cost, rigid or semi-rigid material or bulk semiconductor material for structural support. Furthermore substrate 301 may be a printed circuit board ("PCB") or a package substrate or a semiconductive or non-conductive material. For purposes of clarity by way of example and not limitation, it shall be assumed that substrate 301 is a package substrate, such as a logic package for a stacked die. However, substrate 301 in other examples may be an interposer or other form of substrate for providing an IC, including without limitation a 3D IC.

A conductor seed layer 302 is deposited onto an upper surface of substrate 301. Such seed layer 302 may be an adhesion layer and/or a seed layer ("seed/adhesion layer"). Seed/adhesion layer 302 may be a metal or metal compound, such as for example using one or more of copper (Cu), aluminum (Al), tin (Sn), platinum (Pt), nickel (Ni), gold (Au), tungsten (W), or silver (Ag), or other suitable conductive material. Furthermore, such seed layer may be deposited by plasma vapor deposition (PVD), chemical vapor deposition (CVD), sputtering, printing, plating, or other suitable form of deposition. For purposes of clarity and not limitation, it shall be assumed that seed/adhesion layer 302 is plated. A wet chemistry, such as for electrolytic plating or electroless plating, may be used.

Figure 3A:
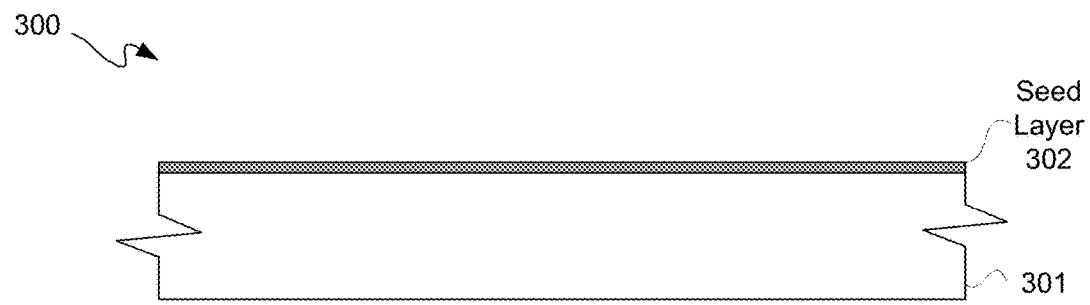
Figure 3B:
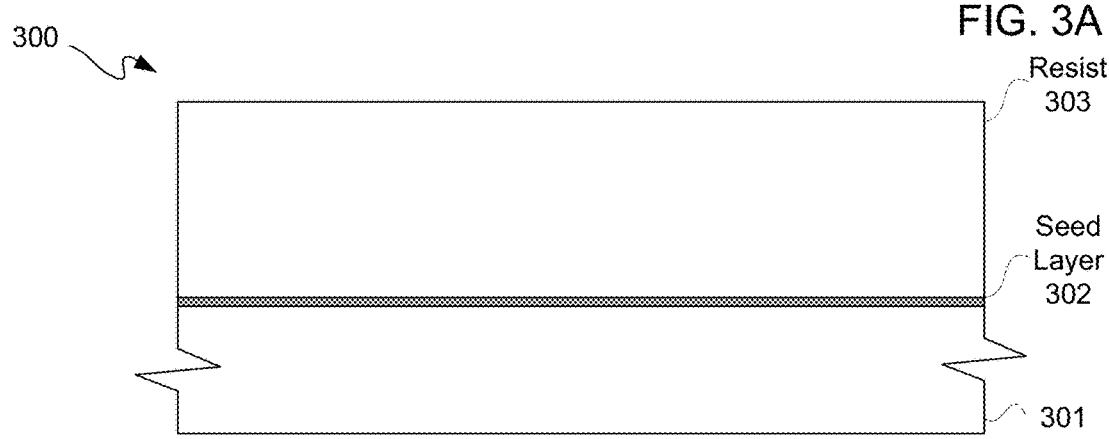
Figure 3C:
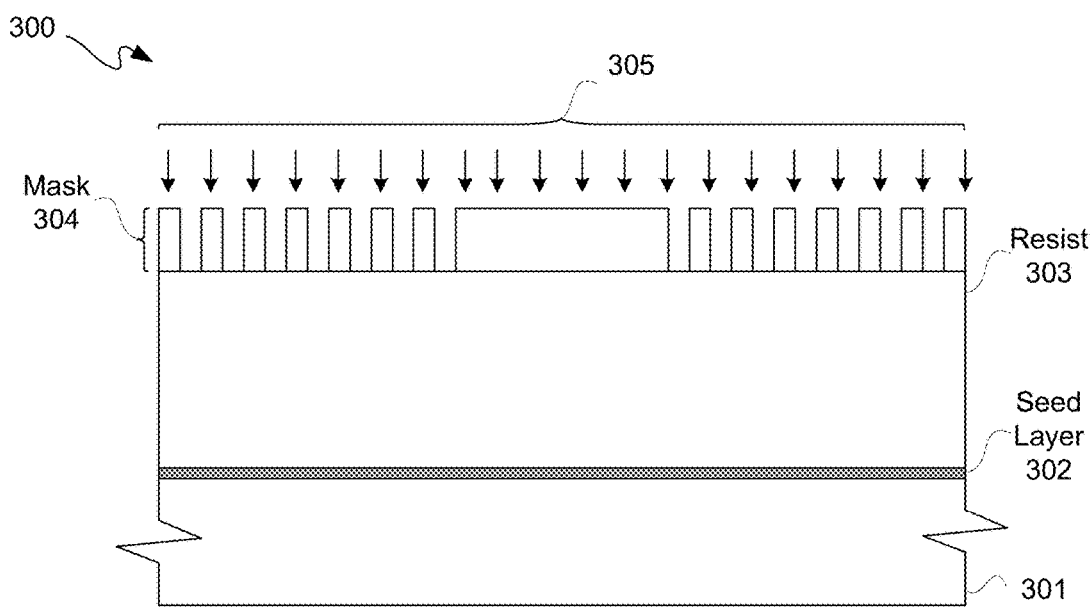
Figure 3D:
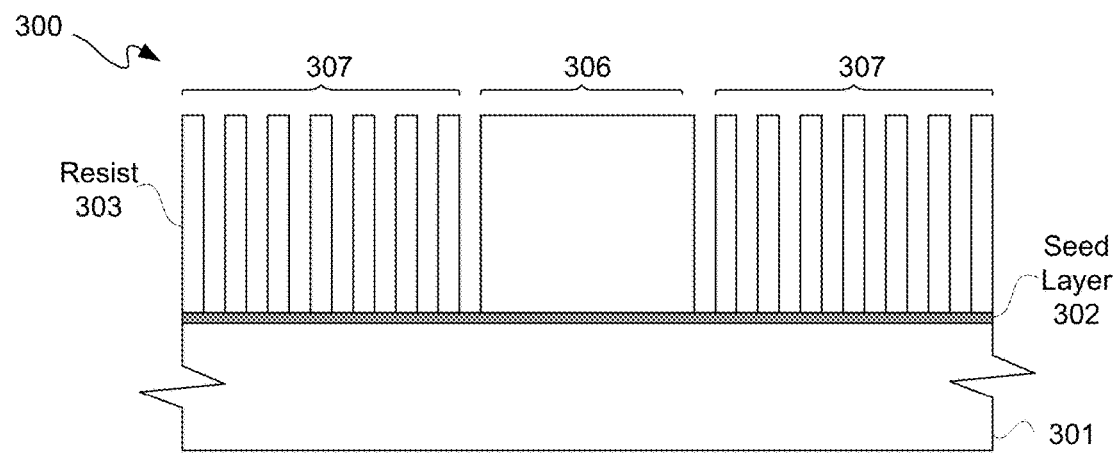

At FIG. 3B, a resist layer 303 is deposited on seed/adhesion layer 302. Resist 303 may be a photoresist or other resist suitable for patterning. At FIG. 3C, a mask 304 is positioned over resist for exposure to light 305, such as in photolithography. Even though the example of a positive resist is used for purposes of clarity, a negative resist may be used in other implementations. For a positive resist 303, portions of such resist 303 exposed to light 305 become soluble to a photoresist developer. At FIG. 3D, such exposed portions of resist 303 are removed. In this example, a central block 306 of resist 303, along with right and left arrays of spaced-apart resist pins 307 to either side of central block 306 are left as disposed on seed/adhesion layer 302.

Figure 3E:
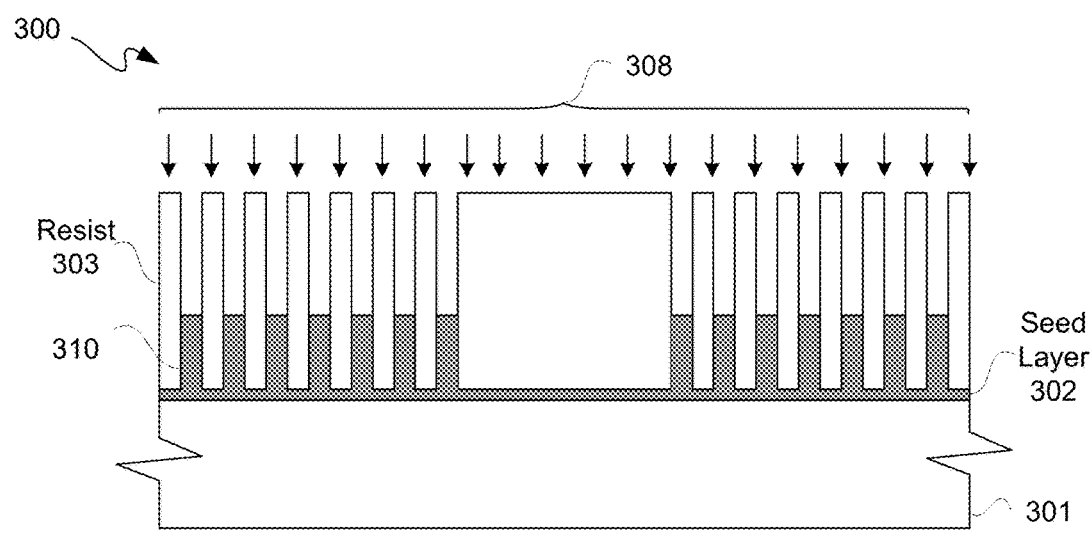

At FIG. 3E, through-mask plating 308 is used to form wires 310, namely "short" wires 310 extending from seed/adhesion layer 302 in gaps between wires of spaced-apart resist pins 307. Plating 308 may be an electrolytic or electroless plating as previously described. Furthermore, another form of conductive material deposition may be used instead of plating 308, such as described elsewhere herein.

As will be appreciated from the following description, alternatively "tall" wires 320 may be formed at FIG. 3E, with a subsequent masking and metal etch back to form "short" wires 310 from a portion of such "tall" wires 320. However, for purposes of clarity by way of example and not limitation, it shall be assumed that short wires 310 are formed at FIG. 3E.

Figure 3F:
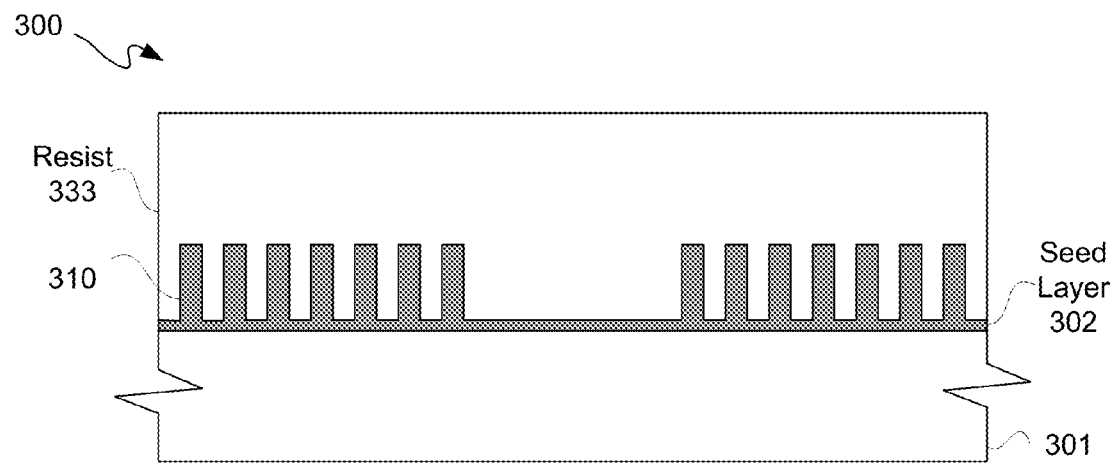

At FIG. 3F, resist 333 is deposited. Optionally, in another implementation, such deposition of resist 333 may not be preceded by a prior removal of resist 303, such as by ashing, after formation of short wires 310. However, in this implementation, resist 303 is removed prior to deposition of resist 333. In one example, an injection printer nozzle maybe used to coat resist or mask at regions to prevent subsequent metal coating in such blocked regions.

Figure 3G:
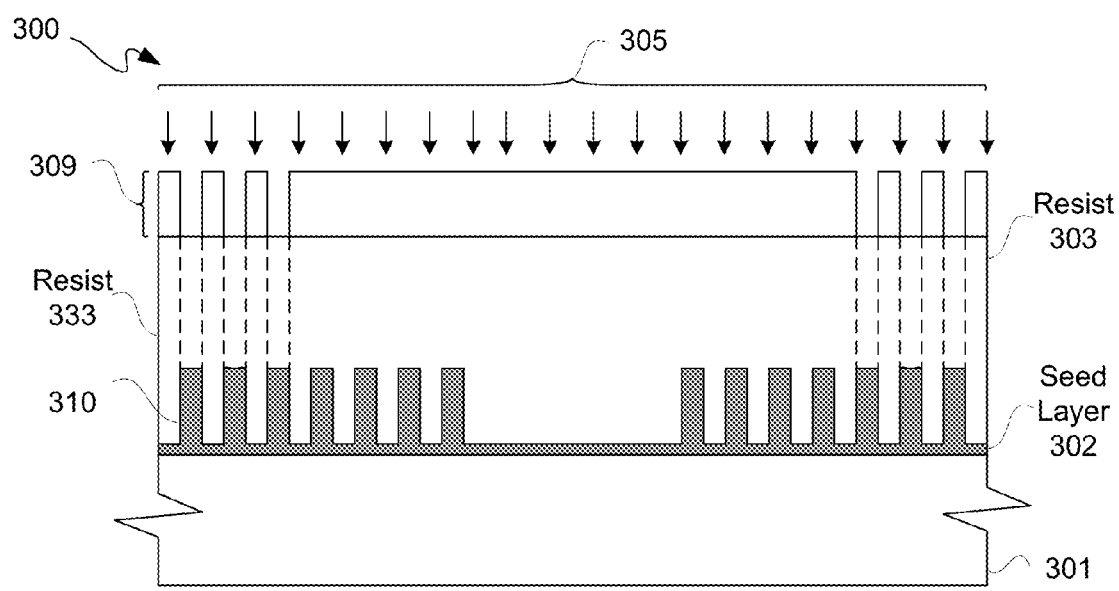
Figure 3H:
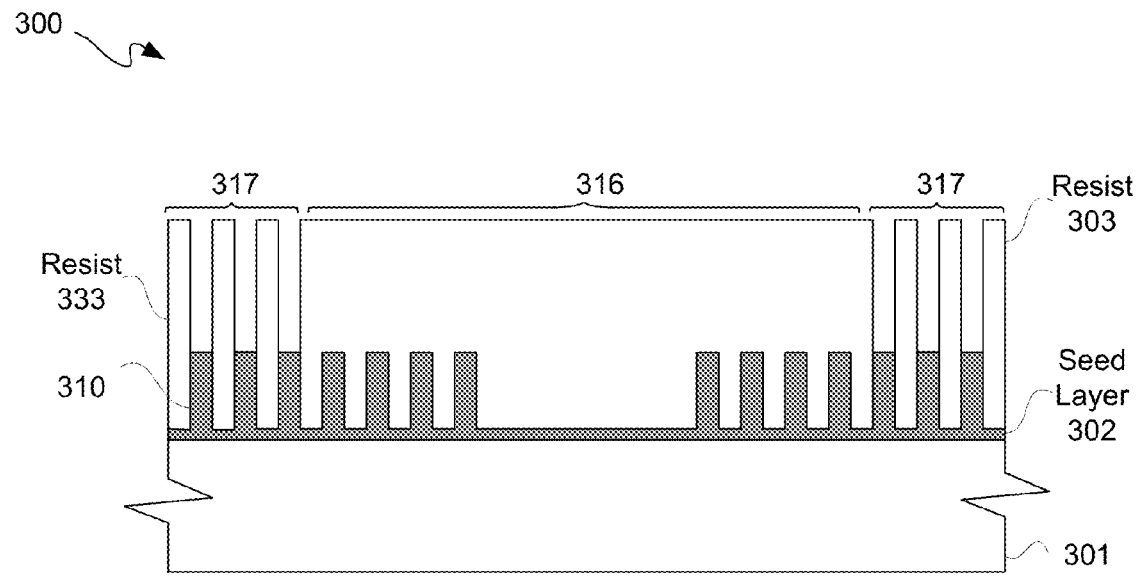

At FIG. 3G, a mask 309 is positioned over resist for exposure to light 305, such as in photolithography. Again, even though the example of a positive resist is used for purposes of clarity, a negative resist may be used in other implementations. At FIG. 3H, such exposed portions of resist 303 are removed. In this example, a central block 316 of resist 303, along with right and left arrays of spaced-apart resist pins 317 to either side of central block 316 are left as disposed on seed/adhesion layer 302 and short wires 310.

Figure 3I:
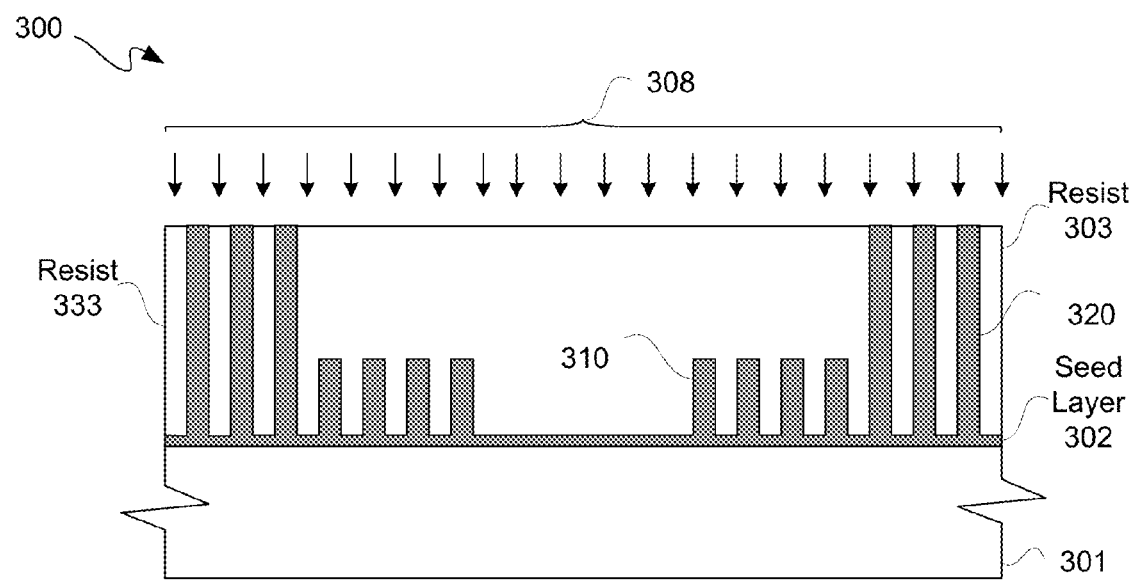

At FIG. 3I, a through-mask plating 308 is used to form tall wires 320 from extending from exposed ends of short wires 310 in gaps between wires of spaced-apart resist pins 317. Again, plating 308 may be an electrolytic or electroless plating as previously described, or another form of conductive material deposition may be used instead of plating 308, such as described elsewhere herein.

Figure 3J:
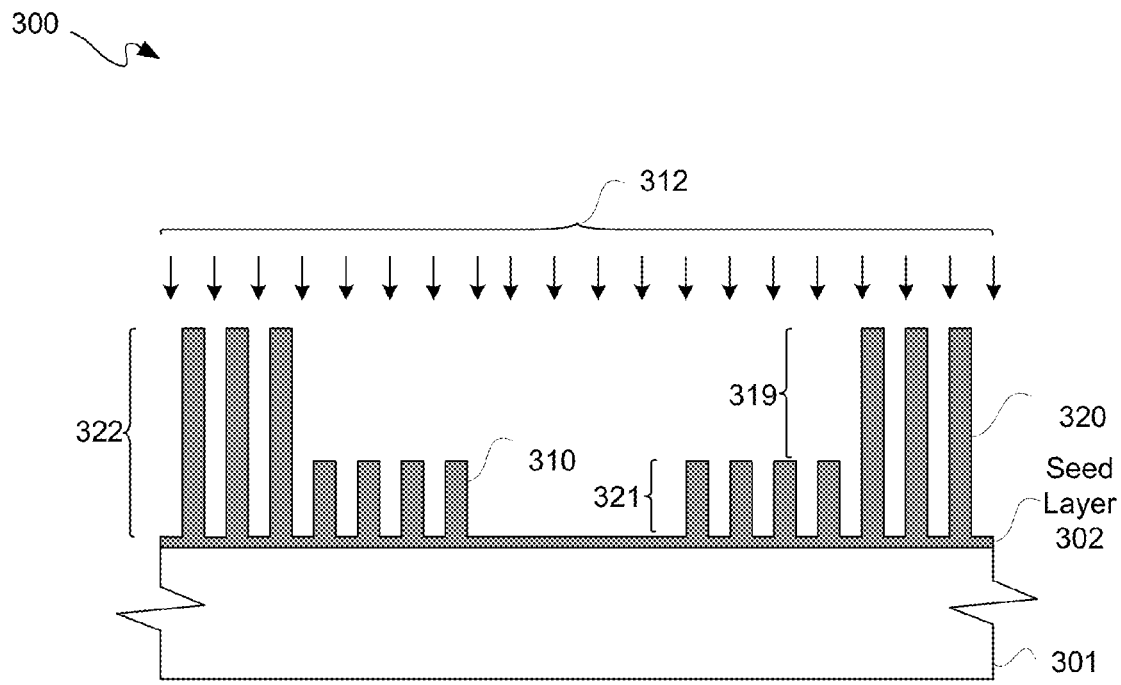

At FIG. 3J, remaining resist 303 may be removed by ashing 312 or by wet resist selectively wet etched or by other known methods. Leaving short wires 310 and tall wires 320 respectively extending from seed/adhesion layer 302. From an upper surface of seed/adhesion layer 302 to distal ends of short wires 310, such short wires 310 may have a height 321. Likewise, from an upper surface of seed/adhesion layer 302 to distal ends of tall wires 320, such tall wires 320 may have a height 322. A difference 319 in heights 321 and 322 from distal ends of short wires 310 to distal ends of tall wires 320 may be at least approximately the thickness of a die to be coupled to such distal ends of short wires 310.

Figure 3K:
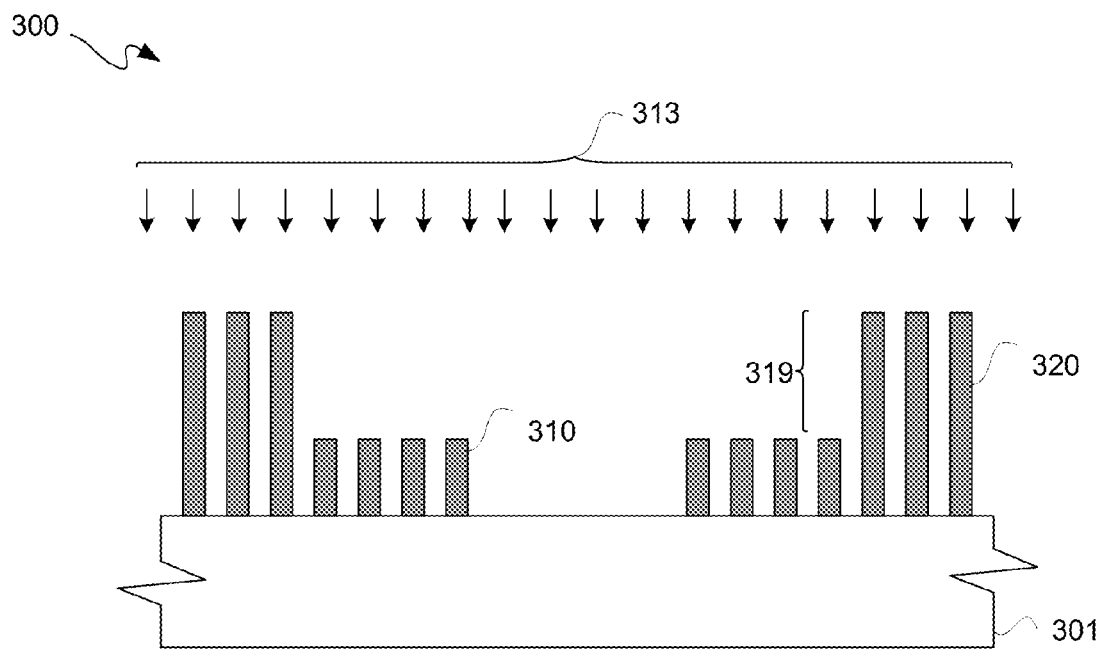

At FIG. 3K, a blanket metal etch 313 may be used to remove seed/adhesion layer 302 not located under and forming part of wires 310 and 320. For example, an anisotropic wet etch may be used. Such etch may remove upper portions of wires 310 and 320. However, a height 319 may be maintained after such blanket metal etch 313. After etching at 313, such assemblage of substrate 301 may be cleaned.

Substrate 301 may have multiple sets of bond via arrays as generally indicated in FIG. 3L. In a set 325, substrate 301 has a first bond via array 324 with short wires 310 extending from a top surface 318 of substrate 301, and a second bond via array 323 with tall wires 320 extending from a top surface 318 of substrate 301. First bond via array 324 is disposed at least partially within second bond via array 323. Short wires 310 of first bond via array 324 are of a first height, such as for example height 321, and tall wires 320 of second bond via array 323 are of a second height, such as for example height 322, greater than such first height for a package-on-package ("PoP") configuration. Attachment of one or more dies may include molding to provide sufficient support for such attachments. Even though generally PoP configurations are described herein, such PoP configurations may include one or more of through mold vias ("TMVs"), TSVs, BGAs, flip-chip interconnects, or other forms of interconnects. Furthermore, configurations other than PoP may be used, including PiP and SiP configurations for example.

In FIG. 3M, a molding layer 673 may be deposited, such that tips of bond via arrays 324, as well as bond via arrays 323, extend above such molding layer 673. Dies 626 and 627, as described below in additional detail, may be respectively interconnected to bond via arrays 324 and 323 at a wafer-level, such as a silicon wafer for example, or other large substrate 301 level. Dies 626 may be interconnected to tips of corresponding bond via arrays 324 by bumps 623, as described below in additional detail, such as flip-chip bonded for example. Rather than bumps 623, optionally wire bonds may be used. However, for purposes of clarity and not limitation, generally bumps 623 are described hereinbelow. In another configuration, stacked or staggered or progressively larger overlapping dies, such as dies 626 and 627 in DRAM or NAND flash for example, may be interconnected using bond via arrays as described herein. In a staggered stacking, bond via array 324 may extend partially within bond via array 323, as bond via array 324 may extend in at least one direction, such as orthogonally with respect to the sheet of the drawing for example, beyond or outside of bond via array 323. For purposes of clarity by way of example and not limitation, it shall be assumed that bond via array 324 is disposed completely within bond via array 323.

Figure 4A:
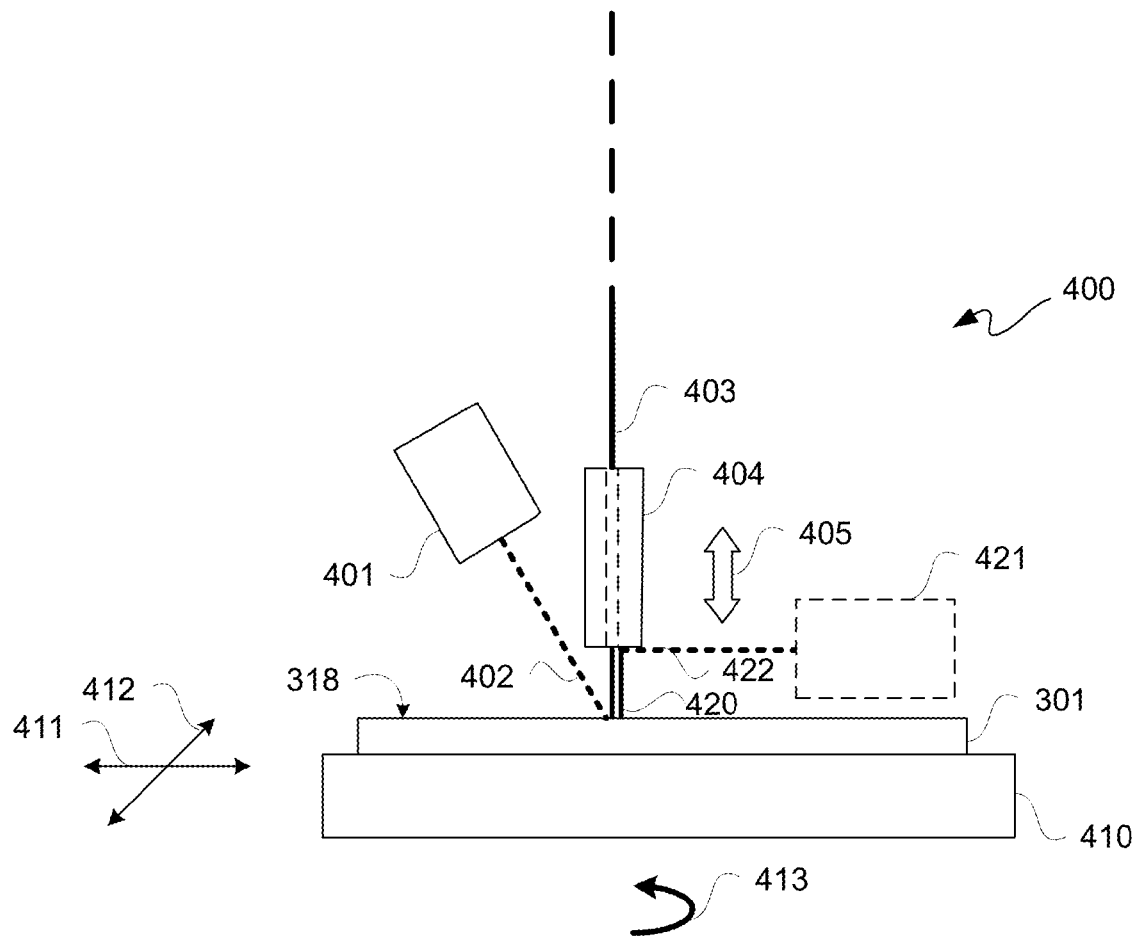
FIG. 4A is a block diagram depicting an exemplary e-beam system.

Optionally, bond via arrays may be formed with e-beam. FIG. 4A is a block diagram depicting an exemplary e-beam system 400. Even though an e-beam is described below, another type of optically provided energy beam may be used, such as a laser beam for example, in other implementations. E-beam system 400 includes an e-beam optical subsystem 401 for controllably generating and projecting an e-beam 402. Wire 403, which may come from a spool housed inside or outside of an e-beam chamber, may be fed into a wire spool control head 404. Wire spool control head 404 may be vertically translated up or down in a z-direction 405 with respect to top surface 318 of substrate 301. Conventionally, e-beam system 400 is computer controlled for determining power level and time to fuse bond wires 420 at a contact zone on top surface 318 of substrate 301. Accordingly, spacing between wires 420 may vary from application to application. Spacing between such wires 420 for a bond via array may be as small as one-diameter of a wire 420 or even smaller.

Wire spool control head 404 may feed wires 403 of various lengths to form bond via arrays of wires 420 of various heights. E-beam 402 may be used to heat ends of such wires 420 for attachment to top surface 318 of substrate 301. Because an e-beam 402 is used for wire bonding, heating is localized so as not to adversely affect other circuitry of substrate 301 or adjacent wire bonds. In other words, a heat affected zone may be so small as to be practically non-existent. Wire spool control head 404 may be configured to precision cut wire 403 for providing such wires 420 of various heights. In this example, a copper wire with a lead (Pb) coating is used for wire 403.

A platen or platform 410, upon which substrate 301 is placed, may be laterally translated in an x-direction 411 and/or y-direction 412. Such translation may be used to provide rows or columns of wires to form bond via arrays with wires of various heights. Furthermore, platform 410 may be rotated 413 for such lateral translation. Optionally, another e-beam optical subsystem 421 or a beam splitting optical subsystem 421 may be used to provide an e-beam 422 for cutting wire 403. With respect to the latter subsystem, such beam splitting optical subsystem 421 may be positioned to split e-beam 402 output from e-beam optical subsystem 401 for providing such optional cutting capability.

Figure 4B:
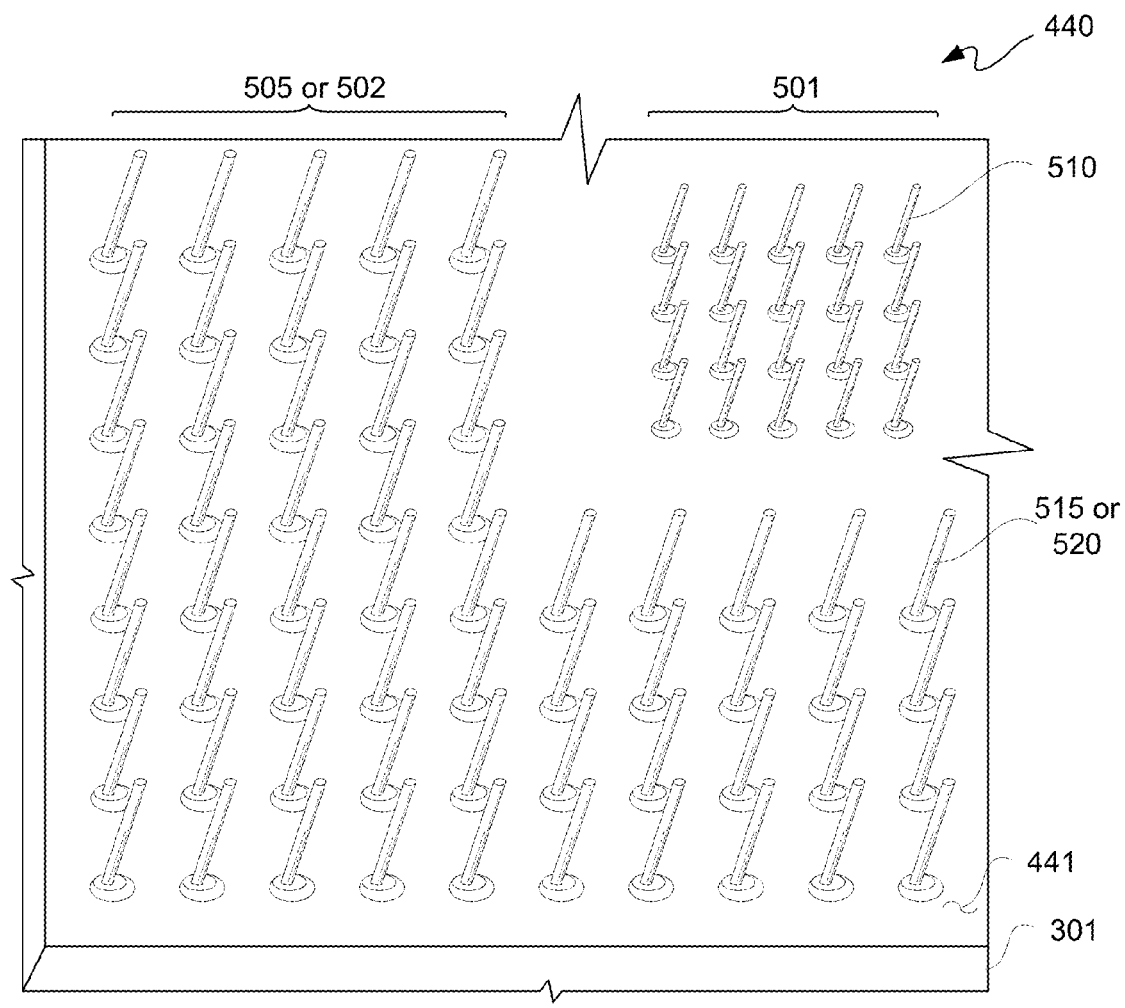
FIG. 4B is a top-down angled perspective view depicting a portion of an exemplary in-process package for a die stack formed using the e-beam system of FIG. 4A.

FIG. 4B is a top-down angled perspective view depicting a portion of an exemplary in-process package 440 for a die stack formed using e-beam system 400 of FIG. 4A. A bond via array 505, or bond via array 502, and 501 may be respectively formed of medium wires 515, or tall wires 520, and short wires 510. In this example, wires 510 and 515 or 520 are fusion bonded to substrate 301 using an e-beam, such as of FIG. 4A. Even though wires 510, 515, and 520 may be at a non-perpendicular angle with respect to surface 441 of a substrate of package 440 to which they are attached or coupled, such as illustratively depicted, in other embodiments such wires may be perpendicular to such surface. Short wires 510 may correspond to short wires 310 of FIG. 3L, and tall wires 520 may correspond to tall wires 320 of FIG. 3L. Medium wires 515 may be between short and tall wires 510 and 520 in height, as described below in additional detail. Wires 510, 515, or 520 may be ball bonded to planar surface 441, such as by EFO wire bonding. Additionally, there may be pads, as well as pad openings, (not shown for purposes of clarity and not limitation) along surface 441.

Figure 4C:
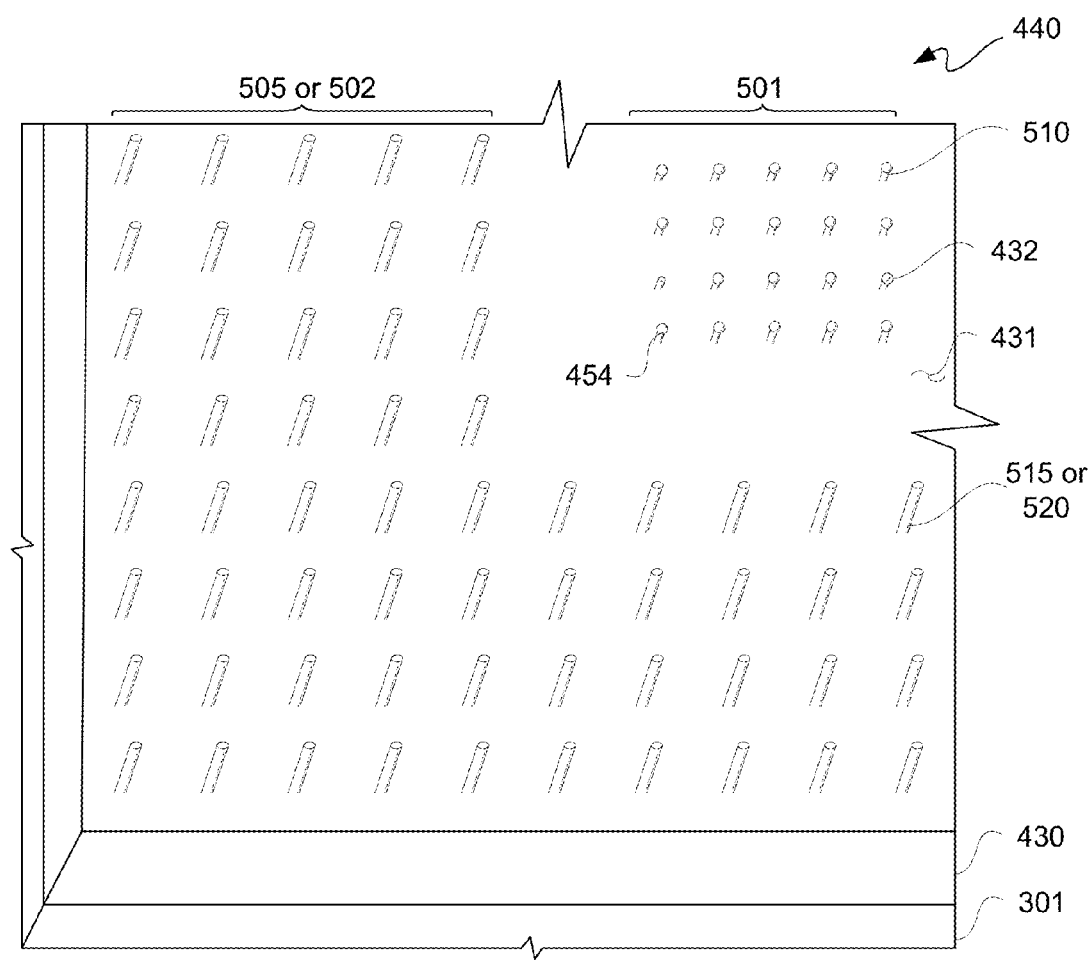
FIG. 4C is the in-process package of FIG. 4B after deposition of a spacer or molding layer onto a top surface of a substrate.

FIG. 4C is the in-process package 440 of FIG. 4B after deposition of a spacer or molding layer 430 onto a top surface of substrate 301. After such deposition, such as described below in additional detail, only top portions of short wires 510, as well as top portions of wires 515 or 520, may extend above a top surface 431 of such spacer layer 430. Along those lines, top ends 432, such as of short wires 510, may be accessible for metallurgical attachment of a die, such as by deposition of solder balls or bumps 454 onto such top ends 432 for reflow for example. In one implementation, a bond structure or structures may be disposed on a die side to be connected or coupled with various wires as described herein.

Figure 5A:
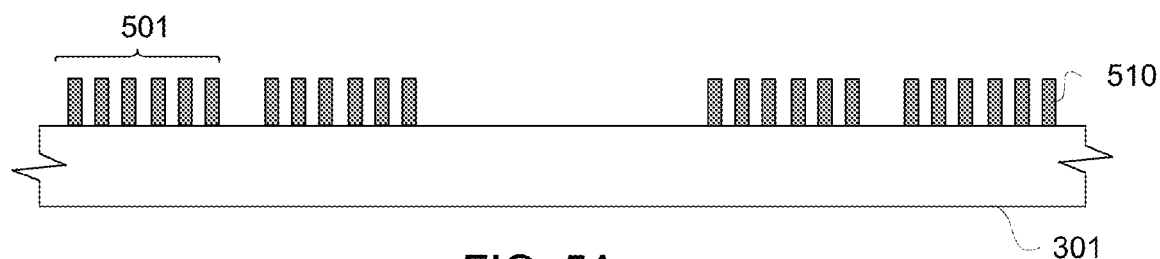
FIGS. 5A through 5D are block diagrams of respective side views of substrates 301 with various exemplary configurations of wires that may be formed using the e-beam system of FIG. 4A or photolithography as generally described with reference to FIGS. 3A through 3M.
Figure 5B:
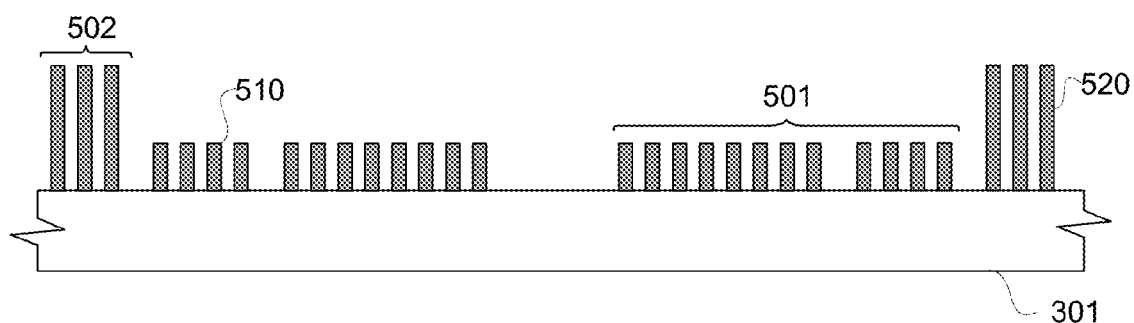

FIGS. 5A through 5D are block diagrams of respective side views of substrates 301 with various exemplary configurations of wires that may be formed using e-beam system 400 of FIG. 4A or photolithography as generally described with reference to FIGS. 3A through 3L. In FIG. 5A, an ultra-high density input/output pitch for a bond via array 501 of short wires 510 extending from substrate 301 is illustratively depicted. Generally, such pitch may be approximately −0.5 mm or less; though larger pitches than this upper limit may be used in some implementations. Additionally, for example, a pitch as small as 10 microns may be used in some implementations. In FIG. 5B, in addition to bond via arrays 501 as in FIG. 5A, substrate 301 has extending therefrom tall wires 520 to provide a bond via array 502. One or more bond via arrays 501 may be located inside of bond via array 502, which may be used for example by a peripheral I/O. Furthermore, tall wires 520 may be formed of a different material than short wires 510. For example, tall wired 520 may be formed of nickel or tungsten (W) and/or their respective alloys, and short wires may be formed another conductive material as described elsewhere herein.

Figure 5C:
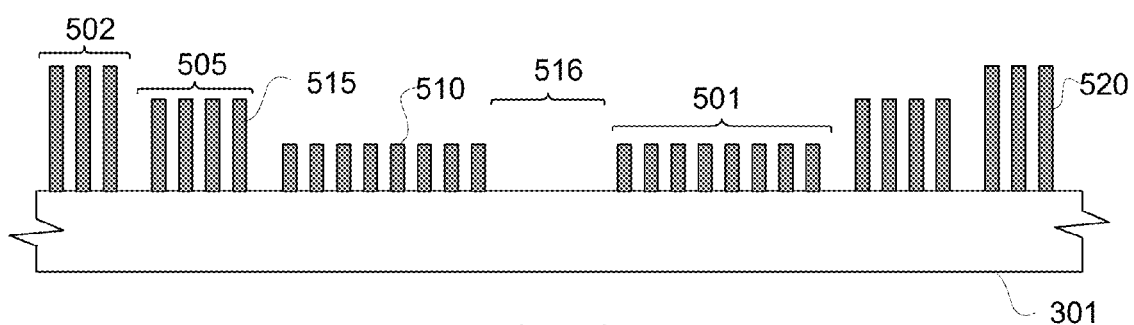
Figure 5D:
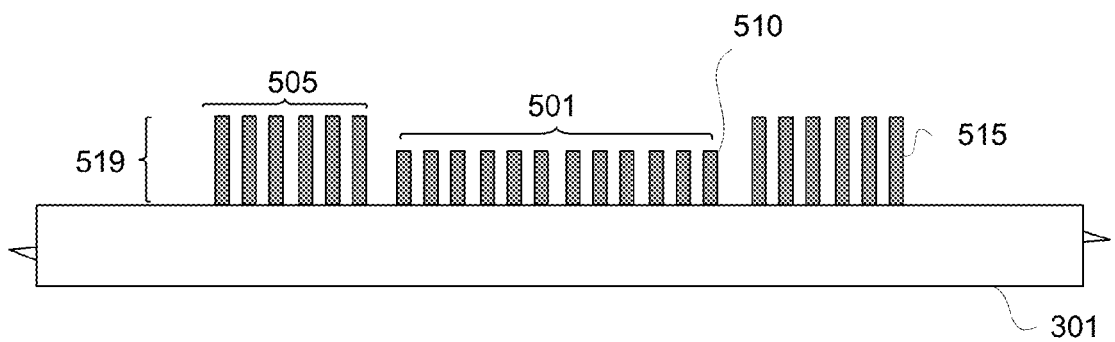
Figure 6A:
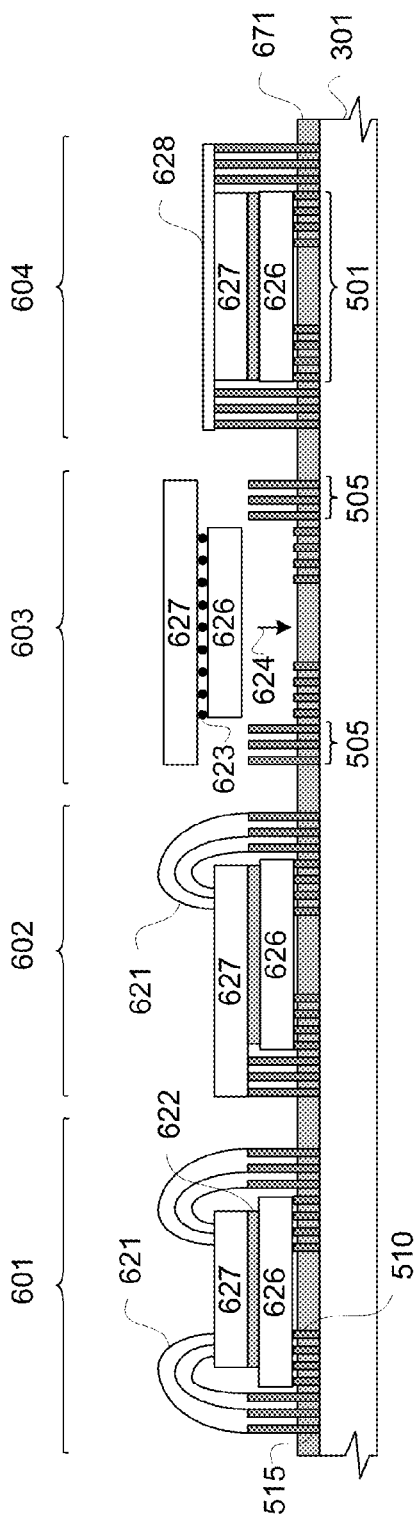
Figure 6B:
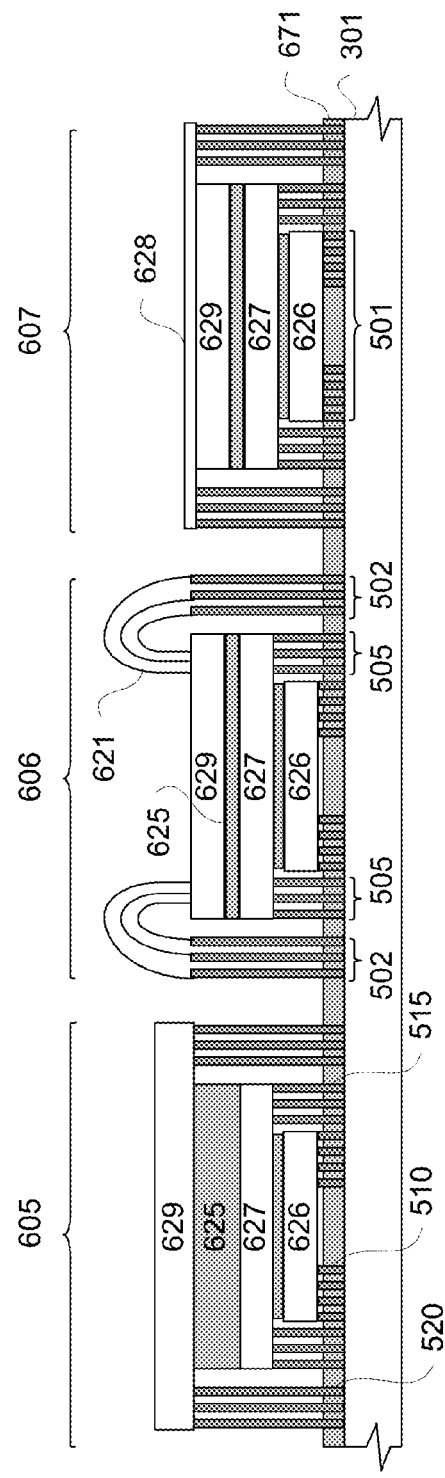

Furthermore, wires of various heights as well as various conductive materials may be used, as generally indicated with reference to FIG. 5C. FIG. 5C includes wires 510 and 520 respectively for bond via arrays 501 and 502 as in FIG. 5B, as well as bond via arrays 505 of "medium" wires 515. Medium wires 515 may have a height 519 which is between heights of wires 510 and 520. Differences in heights as between wires 510, 515, and/or 520 may be to accommodate different thicknesses of one or more dies and/or packages, as well as one or more interfaces therebetween, disposed within an outer bond via array. In the example of FIG. 5C, an inner bond via array 501 has an open middle section 516, and such inner bond via array 501 is within a middle bond via array 505, and such middle bond via array 505 is within an outer bond via array 502. However, bond via arrays may be positioned for close compact stacking too, as illustratively depicted in FIG. 5D, where bond via array 501 has no open middle section 516 and resides within an outer bond via array 505 formed of "middle" wires 515.

FIGS. 6A through 6D are block diagrams of side views of exemplary package-on-package assemblies ("die stacks") 601 through 613 assembled using a substrate 301 having two or more bond via arrays with wires of different heights. Wires of such bond via arrays of die stacks 601 through 613 may be formed using e-beam fusion bonded wires. Optionally, an underfill layer 671 may be deposited on an upper surface of substrate 301 after formation of wires of one or more bond via arrays, as described below in additional detail, such as to provide additional structural support. One or more other underfill layers may follow such underfill layer 671, though they may not be illustratively depicted for purposes of clarity and not limitation. Optionally, underfill layer 671 may be omitted, such as to have a dielectric constant of air and/or to provide for airflow through a package for cooling. FIGS. 6A through 6D are further described with simultaneous reference to FIGS. 5A through 5D, as well as simultaneous reference to FIGS. 6A through 6D.

For die stack 601, short wires 510 of a bond via array 501 coupled to substrate 301 are coupled to a backside surface of a die 626. A front side surface of die 626 may have coupled thereto a spacer layer 622, such as a layer of polymer or an epoxy used for molding and/or encapsulation. A front side surface of a die 627 may be placed on top of such spacer layer 622. A backside surface of die 627 may be wire bonded with wire bonds 621 to top ends of medium wires 515 of a bond via array 505 coupled to substrate 301. In this example, both of dies 626 and 627 are disposed within bond via array 505. In this configuration, die 626 may be referred to as an up or upward facing die, and die 627 may be referred to as a down or downward facing die.

For die stack 602, short wires 510 of a bond via array 501 coupled to substrate 301 are coupled to a backside surface of a die 626. A front side surface of die 626 may have coupled thereto a spacer layer 622. A right side portion of a backside surface of a die 627 may be placed on top of such spacer layer 622 and a left side portion of such backside surface of die 627 may be placed on tops of top ends of a left portion of a bond via array 505 of medium wires 515. A right side portion of a front side surface of die 627 may be wire bonded with wire bonds 621 to top ends of medium wires 515 of a right side portion of bond via array 505 coupled to substrate 301. In this example, both of dies 626 and 627 are upward facing.

For die stack 603, dies 626 and 627 may be attached to one another with intervening bumps or balls ("bumps") 623, such as micro bumps for example. Again, rather than bumps 623, wire bonds may optionally be used. Material for bumps 623 may include one or more of solder, Al, Sn, Ni, Au, Ag, Pb, Bi, Cu, Pt, or the like. For example, bump material may be eutectic Sn/Pb solder, lead-free solder, or high-lead solder. An under bump metallization ("UBM") layer (not shown) and an insulating layer (not shown), as well as other known details for die-to-die interconnect, may be included, though not particularly shown here for purposes of clarity and not limitation. Thus, for example, dies 626 and 627 may be interconnected with a flip-chip, ball grid array ("BGA") or other die-to-die interconnect technology prior to being coupled to substrate 301, as generally indicated by arrow 624. In this example, backside surfaces of dies 626 and 627 face one another. Accordingly, a front side surface of die 626 may be coupled to a bond via array 501, and an un-interconnected portion of such backside surface of die 627 may be coupled to a bond via array 505.

For die stack 604, short wires 510 of a bond via array 501 coupled to substrate 301 are coupled to a backside surface of a die 626. A front side surface of die 626 may have coupled thereto a spacer layer 622. A front side surface of a die 627 may be placed on top of such spacer layer 622. A backside surface of die 627 may be coupled to a redistribution layer ("RDL") 628, which may include one or more metal layers and one or more dielectric layers. Top ends of medium wires 515 of a bond via array 505 coupled to substrate 301 may be coupled to RDL 628 on a same side of die 627 to which RDL 628 is coupled. In this example, both of dies 626 and 627 are disposed within bond via array 505. In this configuration, die 626 is upward facing die, and die 627 is downward facing die.

For die stack 605, short wires 510 of a bond via array 501 coupled to substrate 301 are coupled to a backside surface of a die 626. A front side surface of die 626 may have coupled thereto a spacer layer 622. A backside surface of a die 627 may be placed on top of such spacer layer 622. Top ends of medium wires 515 of a bond via array 505 coupled to substrate 301 may be coupled to such backside surface of die 627, and a front side surface of die 627 may have disposed thereon another spacer layer 625. On top of spacer layer 625 may be disposed a backside surface of a die 629. Top ends of tall wires 520 of a bond via array 502 coupled to substrate 301 may be coupled to such backside surface of die 629. In this example, both of dies 626 and 627 are disposed within bond via array 502. In this configuration, dies 626, 627 and 629 are all upward facing.

Die stack 606 is similar to die stack 605, except generally for the following differences. A backside surface of die 629 may be coupled to RDL 628, and another portion of RDL 628 may be coupled to top ends of tall wires 520 of a bond via array 502 coupled to substrate 301.

Die stack 607 is similar to die stack 606, except generally for the following differences. Rather than wire bonding via wires 621 to top ends of tall wires 520 of a bond via array 502 coupled to substrate 301, and RDL 628 is disposed on an coupled to a top of die 629 and on top ends of wires 520, which coupling may be metallurgical. In this configuration, dies 626 and 627 are upward facing, and die 629 is downward facing.

Die stack 608 is similar to die stack 605, except generally for the following differences. A die 633 is coupled to substrate 301 using a low-profile die-to-die interconnect technology (not shown), such as flip-chip for example. Die 633 is positioned under die 626 and is located within a bond via array 501.

Die stack 609 is similar to die stack 608, except generally for the following differences. A spacer layer 635 is disposed between dies 633 and 626, and a cold plate or other heat sink 640 is coupled to a front side surface of die 629.

Die stack 610 is similar to die stack 608, except generally for the following differences. Die 629 is replaced with dies 631 and 632. A portion of a backside surface of each of dies 631 and 632 is disposed on a spacer layer 625. A left portion of such backside surface of die 631 is coupled to top ends of tall wires 520 of a left side portion of a bond via array 502, and a right side portion of such backside surface of die 632 is coupled to top ends of tall wires 520 of a right side portion of bond via array 502.

Die stack 611 is similar to die stack 610, except generally for the following differences. A die 633 is added, such as previously described with reference to die stack 608.

Die stack 612 is similar to die stack 610, except generally for the following differences. Dies 631 and 632 have respective front sides thereof on spacer layer 625. Backsides of dies 631 and 632 are respectively wire bonded via wires 621 to top ends of tall wires 520 of a bond via array 502 on left and right side portions respectively thereof.

For die stack 613, separate dies 636 and 637 are coupled to short wires 510 of a bond via array 501. Bond via array 501 is disposed within a bond via array 505; however, in this example a portion of bond via array 505, or a separate bond via array 505, is disposed within bond via array 501. Dies 636 and 637 may have their respective front side surfaces coupled to bond via array 501. An RDL 628 is metallurgically coupled to top ends of bond via array or arrays 505, as well as to respective backside surfaces of dies 636 and 637. A top surface of RDL 628 has metallurgically coupled thereto respective backside surfaces of dies 638 and 639. Dies 638 and 639 may be positioned above dies 636 and 637, respectively.

FIGS. 6E-1 through 6E-9 are block diagrams of side views of exemplary package-on-package assemblies ("die stacks") 603R, 604R, 605R, 607R, 608R, 609R, 610R, 611R, and 613R, each of which may have two or more bond via arrays with wires of different heights. With simultaneous reference to FIGS. 6A through 6D and 6E-1 through 6E-9, die stacks 603R, 604R, 605R, 607R, 608R, 609R, 610R, 611R, and 613R are further described. Generally, die stacks 603R, 604R, 605R, 607R, 608R, 609R, 610R, 611R, and 613R respectively correspond to 603, 604, 605, 607, 608, 609, 610, 611, and 613, except that die stacks 603R, 604R, 605R, 607R, 608R, 609R, 610R, 611R, and 613R may be assembled in a reverse direction or order ("upside down"). Additionally, die stack 607R may have dies 626, 627 and 629 sequentially interconnected using bumps 623, and die stacks 608R and 611R may have dies 633 and 626 interconnected using bumps 623. Additionally, optionally die 627 may include TSVs 667 for interconnect dies 626 and 629 through such TSVs 667. Along those lines, even though bond via arrays or bumps are illustratively depicted in die stacks as described herein, in some implementations such bumps or balls may be switched for bond via arrays, and vice versa. Additionally, in die stack 613R, a bond via array 505 between dies 636 and 637 in die stack 613 may be omitted in die stack 613R. An initial or base die or dies in one or more of die stacks 603R, 604R, 605R, 607R, 608R, 609R, 610R, 611R, and 613R may be an interposer.

Die stacks 603R, 604R, 605R, 607R, 608R, 609R, 610R, 611R, and 613R may be assembled before or after singulation. Furthermore, one or more of die stacks 603R, 604R, 605R, 607R, 608R, 609R, 610R, 611R, and 613R may be coupled to a substrate, such as substrate 301 for example.

FIGS. 7A through 7E-3 are block diagrams of side views depicting several exemplary die stacks 701 through 703, which may in part be commonly formed with reference to FIGS. 7A through 7D. Processing of such die stacks 701 through 703 may be included as part of process flow 300. With simultaneous reference to FIGS. 7A through 7E-3, exemplary die stacks 701 through 703 are further described.

Figure 7A:
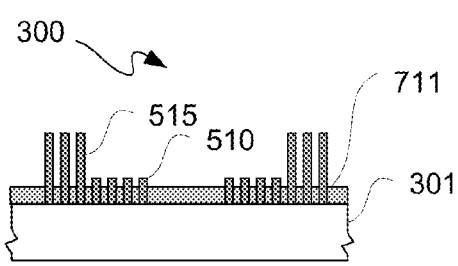
FIGS. 7A through 7E-3 are block diagrams of side views depicting several exemplary die stacks, which may in part be commonly formed with reference to FIGS. 7A through 7D thereof.

At FIG. 7A, to provide a spacer layer 711, an adhesive, encapsulant or molding compound, such as used to provide a spacer layer as previously described, may be deposited, such as by any of a variety of paste printing, transfer molding, liquid encapsulant molding, vacuum laminating, spin coating or other suitable application. Spacer layer 711 may be formed over substrate 301 such that such molding compound surrounds wires 510 and 515, with top portions thereof extending above an upper surface of spacer layer 711. Spacer layer 711 may provide additional support for wires 510, as well as subsequently wires 515, for attachment of a die.

Figure 7B:
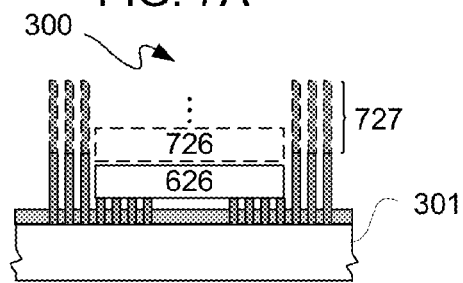

At FIG. 7B, a die 626 may be attached to top ends of short wires 510. Even though attachment of a single die 626 is described below in additional detail, a stack of dies, such as die 626 and another die 726, as well as other die, may optionally be coupled to one another in a stack. In such an implementation, longer outer BVA wires, as generally indicated by optional lengths 727, may be used to accommodate a die stack. In one implementation, the stack of dies over die 626 may be couple to another via through die connectors or electrodes or TSVs.

Figure 7C:
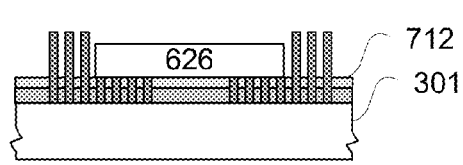

At FIG. 7C, an underfill layer 712 may be deposited so as to be disposed over spacer layer 711, as well as under die 626. Optionally, underfill layer 712 may be deposited after spacer layer 711 is deposited but before attachment of die 626. At FIG. 7D, another spacer layer 713 may be deposited, such as previously described with reference to spacer layer 711, so as to surround a sidewall or sidewalls of die 626, as well as to be disposed around medium wires 515. Top portions of medium wires 515 extend above an upper surface of spacer layer 713.

Figure 7D:
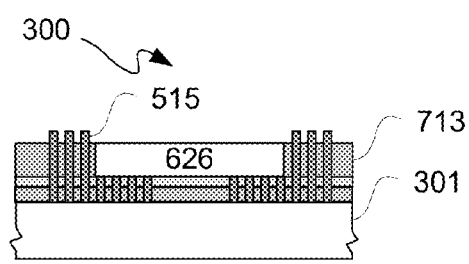
Figures 1, 7E:
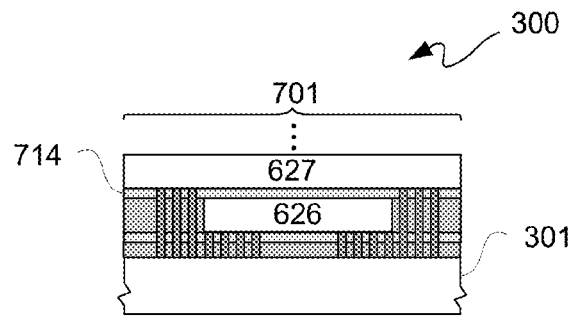

For die stack 701, at FIG. 7E-1 a die 627 may be coupled to such top portions of medium wires of FIG. 7D, and subsequent thereto another underfill layer 714 may be deposited under die 627. Optionally, one or more other dies 627 may be part of such die stack 701.

Figures 2, 7E:
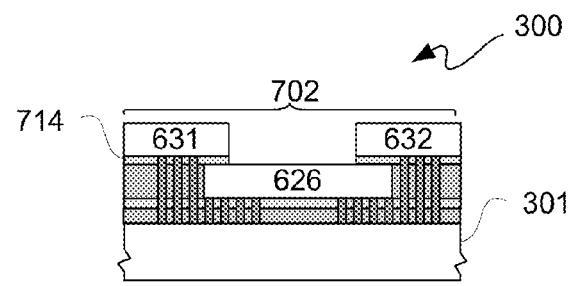

For die stack 702, at FIG. 7E-2 dies 631 and 632 may respectively be coupled to such top portions of medium wires of FIG. 7D, and subsequent thereto an underfill layer 714 may be deposited under dies 631 and 632.

Figures 3, 7E:
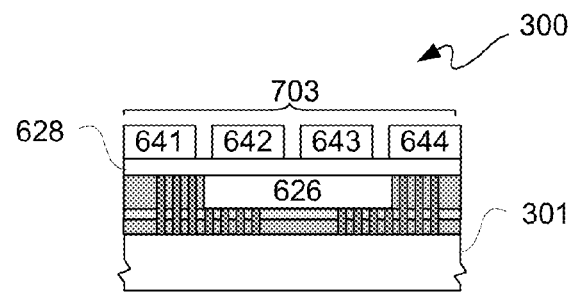

For die stack 703, at FIG. 7E-3 an RDL 628 may respectively be coupled to top portions of medium wires of FIG. 7D, and be metallurgically coupled to die 626. One or more dies 641 through 644 may be metallurgically coupled to a top surface of RDL 628.

Accordingly, it should be understood that substrate 301 may be a wafer for wafer-level packaging, or substrate 301 may be an individual package substrate for chip-level packaging. It should further be understood that multiple wires of varying diameters and lengths may be used. Along those lines, generally short wires may have a length in a range of approximately 0.01 to 0.1 mm, a diameter in a range of approximately 0.01 to 0.1 mm, and a pitch in a range of approximately less than 0.5 mm. Generally medium wires may have a length in a range of approximately 0.05 to 0.5 mm, a diameter in a range of approximately 0.01 to 0.1 mm, and a pitch in a range of approximately 0.01 to 0.5 mm. Generally tall wires may have a length in a range of approximately 0.1 to 1 mm, a diameter in a range of approximately 0.01 to 0.2 mm, and a pitch in a range of approximately 0.01 to 0.5 mm. Additionally, such short, medium and tall wires may be made of different materials for different conductivities and/or varying e-moduli. Such wires may be formed with e-beam may have minimal intermetallic formation with fast fusion bonding, minimal thermal preload on a package, and/or reduced stress in a package. Furthermore, such wires formed with e-beam or with photolithography may be vertical wires for densely packed bond via arrays.

Generally, wires, such as wires 510, 515, and 520 are vertical within +/−3 degrees with respect to being perpendicular to a top surface 318 of substrate 301. However, such wires need not be formed with such verticality in other implementations.

Figure 8A:
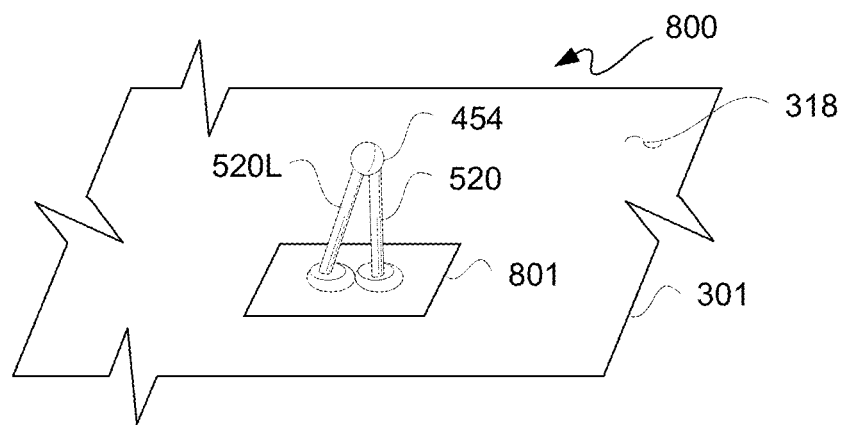
FIGS. 8A and 8B are respective top-down perspective views depicting exemplary angled wire configurations.
Figure 8B:
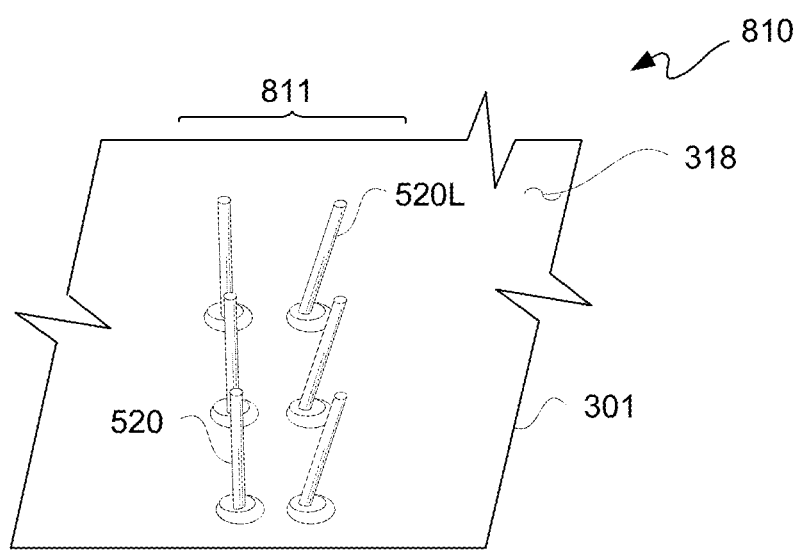

FIGS. 8A and 8B are respective top-down perspective views depicting exemplary angled wire configurations 800 and 810. In angled wire configuration 800, an angled tall wire 520L and a tall wire 520 are fuse bonded to a same landing pad 801 on a top surface 318 of substrate 301. A solder ball or bump 454 may be commonly deposited on top ends of such wires 520L and 520. In this angled wire configuration 800, which may be used for a high-power, a robust ground or supply, or other application, angled tall wire 520L may generally be in a range of approximately less than 90 degrees with respect to top surface 318. In angled wire configuration 810, a bond via array 811 includes angled tall wires 520L, as well as vertical tall wires 520. Angled tall wires 520 may be used to extend to a different die than tall wires 520, to provide a wire bonding surface separate from vertical tall wires 520 which may be coupled to a die or RDL, or other application. Along the above lines, at least one bond via array, whether for tall, medium, or short wires, may have a portion of such wires thereof being angled wires, such as angled wires 520L for example.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method, comprising:
    obtaining a substrate;
    feeding wire from a wire spool control head for:
        forming a first bond via array of first wire bond wires ("first wires") extending from a surface of the substrate having rows and columns of the first wires; and
        forming a second bond via array of second wire bond wires ("second wires") extending from the surface of the substrate having rows and columns of the second wires;
    wherein the first bond via array and the second bond via array are external to the substrate;
    wherein the first bond via array is disposed within a region of the second bond via array;
    wherein the first wires of the first bond via array are of a first height; and
    wherein the second wires of the second bond via array are of a second height greater than the first height for a package-on-package configuration;
    wherein a first pitch of the first wires of the first bond via array is less than 0.5 mm; and
    wherein a second pitch of the second wires of the second bond via array is a range of approximately 0.01 to 0.5 mm.

2. The method according to claim 1, further comprising:
    coupling a first die to the first bond via array; and
    coupling a second die to the second bond via array;
    wherein the second die is disposed over the first die.

3. The method according to claim 2, wherein the first die and at least a portion of the second die are located within a perimeter of the second bond via array.

4. The method according to claim 2, further comprising coupling opposing surfaces of the first die and the second die to one another.

5. The method according to claim 2, further comprising attaching the first wires of the first bond via array and the second wires of the second bond via array by fusion bonding to the surface of the substrate.

6. The method according to claim 2, wherein a portion of the second wires are formed as angled wires with an angle less than approximately 90 degrees with reference to the surface of the substrate.

7. The method according to claim 2, wherein the first die and the second die are coupled to one another.

8. The method according to claim 7, wherein the first die and the second die are coupled to one another by die-to-die interconnects.

9. The method according to claim 7, wherein the first die and the second die are coupled to one another by a spacer layer.

10. The method according to claim 7, wherein the first die and the second die are coupled to one another by a redistribution layer.

11. The method according to claim 2, wherein the package-on-package configuration comprises:
the first die coupled to first ends of the first wires on a backside surface of the first die as a downward facing die; and
the second die coupled to second ends of the second wires on a backside surface of the second die as an upward facing die.

12. The method according to claim 2, wherein the package-on-package configuration comprises:
the first die coupled to first ends of the first wires on a backside surface of the first die as a downward facing die; and
the second die coupled to second ends of the second wires on a backside surface of the second die as a downward facing die.

13. The method according to claim 2, wherein the package-on-package configuration comprises:
the first die coupled to first ends of the first wires on a front side surface of the first die as an upward facing die; and
the second die coupled to second ends of the second wires on a backside surface of the second die as a downward facing die; and
wherein a backside surface of the first die is coupled to the backside surface of the second die by die-to-die interconnects.

14. The method according to claim 1, wherein:
the first pitch of the first wires of the first bond via array is a first wire diameter of the first wires; and
the second pitch of the second wires of the second bond via array is a second wire diameter of the second wires.

15. The method according to claim 14, wherein the first wire diameter is smaller than the second wire diameter.

16. The method according to claim 14, wherein a portion of at least one of the first wires or the second wires includes angled wires thereof.

17. The method according to claim 1, further comprising:
coupling an integrated circuit die to the first bond via array;
coupling a redistribution layer to the second bond via array; and
wherein the redistribution layer is disposed over the integrated circuit die.

18. A method, comprising:
feeding wire from a wire spool control head for:
forming a first bond via array of first wire bond wires extending from a surface of a die having rows and columns of the first wire bond wires; and
forming a second bond via array of second wire bond wires extending from a surface of a redistribution layer having rows and columns of the second wire bond wires;
wherein the first bond via array and the second bond via array are external to the die and the redistribution layer, respectively;
wherein the first bond via array is disposed within a region of the second bond via array;
wherein the first wire bond wires of the first bond via array are of a first height;
wherein the second wire bond wires of the second bond via array are of a second height greater than the first height for a package-on-package configuration;
wherein a first pitch of the first wire bond wires of the first bond via array is in less than 0.5 mm; and
wherein a second pitch of the second wire bond wires of the second bond via array is a range of approximately 0.01 to 0.5 mm.

19. A method, comprising:
feeding wire from a wire spool control head for:
forming a first bond via array of first wire bond wires extending from a surface of a first die having rows and columns of the first wire bond wires; and
forming a second bond via array of second wire bond wires extending from a surface of a second die having rows and columns of the second wire bond wires;
wherein the first bond via array and the second bond via array are external to the first die and the second die, respectively;
wherein the first bond via array is disposed within a region of the second bond via array;
wherein the first wire bond wires of the first bond via array are of a first height;
wherein the second wire bond wires of the second bond via array are of a second height greater than the first height for a package-on-package configuration;
wherein a first pitch of the first wire bond wires of the first bond via array is less than 0.5 mm; and
wherein a second pitch of the second wire bond wires of the second bond via array is a range of approximately 0.01 to 0.5 mm.

20. The method according to claim 1, wherein the first wires and the second wires are made of different materials to provide at least one of different conductivities or e-moduli as between the first wires and the second wires.

* * * * *